United States Patent
Rajan et al.

(10) Patent No.: US 11,081,555 B2
(45) Date of Patent: Aug. 3, 2021

(54) ELECTRONIC DEVICES WITH ULTRA-HIGH DIELECTRIC CONSTANT PASSIVATION AND HIGH MOBILITY MATERIALS

(71) Applicant: Ohio State Innovation Foundation, Columbus, OH (US)

(72) Inventors: Siddharth Rajan, Columbus, OH (US); Zhanbo Xia, Columbus, OH (US); Caiyu Wang, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 83 days.

(21) Appl. No.: 16/455,736

(22) Filed: Jun. 27, 2019

(65) Prior Publication Data
US 2020/0006500 A1  Jan. 2, 2020

Related U.S. Application Data

(60) Provisional application No. 62/690,493, filed on Jun. 27, 2018.

(51) Int. Cl.
*H01L 29/40* (2006.01)
*H01L 29/49* (2006.01)
(Continued)

(52) U.S. Cl.
CPC ........ *H01L 29/408* (2013.01); *H01L 29/4908* (2013.01); *H01L 29/517* (2013.01);
(Continued)

(58) Field of Classification Search
CPC . H01L 29/408; H01L 29/4908; H01L 29/517; H01L 29/7786; H01L 29/7788;
(Continued)

(56) References Cited

U.S. PATENT DOCUMENTS

| | | | | |
|---|---|---|---|---|
| 4,890,150 A | * | 12/1989 | Vera | H01L 24/02 257/493 |
| 6,646,293 B2 | * | 11/2003 | Emrick | H01L 29/66318 257/190 |

(Continued)

OTHER PUBLICATIONS

E. Johnson, "Physical limitations on frequency and power parameters of transistors," in Proc. IRE Int. Conv. Rec., New York, NY, USA, Mar. 1965, pp. 27-34.

(Continued)

*Primary Examiner* — Lex H Malsawma
(74) *Attorney, Agent, or Firm* — Meunier Carlin & Curfman LLC

(57) ABSTRACT

Dielectric super-junction transistors use combinations high dielectric relative permittivity materials and high-mobility materials. An associated electronic device includes a junction portion of a barrier layer adjacent a gate contact and a drain contact. A layered semiconductor device is configured with a junction dielectric permittivity that is greater than a channel dielectric permittivity in the channel layer. The junction portion has a dielectric structure that polarizes carriers within the junction portion such that excess charge on the gate is compensated by an opposite charge in the junction portion of the barrier layer proximate the gate. A sheet charge in the barrier layer is increased to form a depletion region with the channel layer that avoids a conductive parallel channel in the barrier layer to the drain contact.

9 Claims, 22 Drawing Sheets

(51) Int. Cl.
H01L 29/51 (2006.01)
H01L 29/778 (2006.01)
H01L 29/861 (2006.01)
H01L 29/872 (2006.01)

(52) U.S. Cl.
CPC ...... *H01L 29/7786* (2013.01); *H01L 29/7788* (2013.01); *H01L 29/8611* (2013.01); *H01L 29/8613* (2013.01); *H01L 29/872* (2013.01)

(58) Field of Classification Search
CPC . H01L 29/8611; H01L 29/8613; H01L 29/872
See application file for complete search history.

(56) References Cited

U.S. PATENT DOCUMENTS

| | | | |
|---|---|---|---|
| 9,799,733 B2* | 10/2017 | Kawakami | H01L 29/872 |
| 2005/0280114 A1* | 12/2005 | Singh | H01L 29/861 257/502 |
| 2014/0103357 A1* | 4/2014 | Decoutere | H01L 27/0629 257/76 |
| 2020/0135478 A1* | 4/2020 | Passlack | H01L 29/7786 |

OTHER PUBLICATIONS

T. Palacios et al., "High-power AlGaN/GaN HEMTs for Ka-band applications," IEEE Electron Device Lett., vol. 26, No. 11, pp. 781-783, Nov. 2005, doi: 10.1109/LED.2005.857701.
H. Sun et al., "102-GHz AlInN/GaN HEMTs on silicon with 2.5-W/mm output power at 10 GHz," IEEE Electron Device Lett., vol. 30, No. 8, pp. 796-798, Aug. 2009, doi:10.1109/LED.2009.2023603.
Y. Tang et al., "Ultrahigh-speed GaN high-electron-mobility transistors with fT/fmax of 454/444 GHz," IEEE Electron Device Lett., vol. 36, No. 6, pp. 549-551, Jun. 2015, doi:10.1109/LED.2015.2421311.
R. Coffie, "Slant field plate model for field-effect transistors," IEEE Trans. Electron Devices, vol. 61, No. 8, pp. 2867-2872, Aug. 2014, doi: 10.1109/TED.2014.2329475.
A. Chini, D. Buttari, R. Coffie, S. Heikman, S. Keller, and U. K. Mishra, "12 W/mm power density AlGaN/GaN HEMTs on sapphire substrate," Electron. Lett., vol. 40, No. 1, pp. 73-74, Jan. 2004, doi: 10.1049/el:20040017.
H. Xing, Y. Dora, A. Chini, S. Heikman, S. Keller, and U. K. Mishra, "High breakdown voltage AlGaN—GaN HEMTs achieved by multiple field plates," IEEE Electron Device Lett., vol. 25, No. 4, pp. 161-163, Apr. 2004, doi: 10.1109/LED.2004.824845.
Y.-F. Wu et al., "30-W/mm GaN HEMTs by field plate optimization," IEEE Electron Device Lett., vol. 25, No. 3, pp. 117-119, Mar. 2004, doi: 10.1109/LED.2003.822667.
T. Fujihira, "Theory of semiconductor superjunction devices," Jpn. J. Appl. Phys., vol. 36, p. 6254, Oct. 1997, doi: 10.1143/JJAP.36.6254.
T. Kabemura, S. Ueda, Y. Kawada, and K. Horio, "Enhancement of breakdown voltage in AlGaN/GaN HEMTs: Field plate plus high-k-passivation layer and high acceptor density in buffer layer," IEEE Trans. Electron Devices, vol. 65, No. 9, pp. 3848-3854, Sep. 2018, doi: 10.1109/TED.2018.2857774.
H. J. Kim et al., "High mobility in a stable transparent perovskite oxide," Appl. Phys. Express, vol. 5, No. 6, p. 061102, 2012, doi: 10.1143/APEX.5.061102.
X. Luo et al., "High carrier mobility in transparent Ba1—xLaxSnO3 crystals with a wide band gap," Appl. Phys. Lett., vol. 100, No. 17, p. 172112, 2012, doi: 10.1063/1.4709415.
S. Raghavan, T. Schumann, H. Kim, J. Y. Zhang, T. A. Cain, and S. Stemmer, "High-mobility BaSnO3 grown by oxide molecular beam epitaxy," APL Mater., vol. 4, No. 1, p. 016106, 2016, doi: 10.1063/1.4939657.
E. H. Smith et al., "Exploiting kinetics and thermodynamics to grow phase-pure complex oxides by molecular-beam epitaxy under continuous co-deposition," Phys. Rev. Mater., vol. 1, No. 2, p. 023403, 2017, doi: 10.1103/PhysRevMaterials.1.023403.
A. Prakash et al., "Hybrid molecular beam epitaxy for the growth of stoichiometric BaSnO3," J. Vac. Sci. Technol. A, Vac., Surf., Films, vol. 33, No. 6, p. 060608, 2015, doi: 10.1116/1.4933401.
H. Mizoguchi, H. W. Eng, and P. M. Woodward, "Probing the electronic structures of ternary perovskite and pyrochlore oxides containing Sn4+ or Sb5+," Inorganic Chem., vol. 43, No. 5, pp. 1667-1680, 2004, doi: 10.1021/ic034551c.
S. A. Chambers, T. C. Kaspar, A. Prakash, G. Haugstad, and B. Jalan, "Band alignment at epitaxial BaSnO3/SrTiO3(001) and BaSnO3/LaAlO3(001) heterojunctions," Appl. Phys. Lett., vol. 108, No. 15, p. 152104, 2016, doi: 10.1063/1.4946762.
S. J. Allen, S. Raghavan, T. Schumann, K.-M. Law, and S. Stemmer, "Conduction band edge effective mass of La-doped BaSnO3," Appl. Phys. Lett., vol. 108, No. 25, p. 252107, 2016, doi: 10.1063/1.4954671.
F. M. Pontes, E. J. H. Lee, E. R. Leite, E. Longo, and J. A. Varela, "High dielectric constant of SrTiO3 thin films prepared by chemical process," J. Mater. Sci., vol. 35, No. 19, pp. 4783-4787, 2000, doi: 10.1023/A:1004816611050.
H. Tabata, H. Tanaka, and T. Kawai, "Formation of artificial BaTiO3/SrTiO3 superlattices using pulsed laser deposition and their dielectric properties," Appl. Phys. Lett., vol. 65, No. 15, pp. 1970-1972, 1994, doi: 10.1063/1.112837.
C. M. Carlson et al., "Large dielectric constant ( $\varepsilon / \varepsilon 0$ >6000) Ba0.4Sr0.6TiO3 thin films for high-performance microwave phase shifters," Appl. Phys. Lett., vol. 76, No. 14, pp. 1920-1922, 2000, doi: 10.1063/1.126212.
C. T. Black and J. J. Welser, "Electric-field penetration into metals: Consequences for high-dielectric-constant capacitors," IEEE Trans. Electron Devices, vol. 46, No. 4, pp. 776-780, Apr. 1999, doi: 10.1109/16.753713.
D. E. Cox, B. Noheda, G. Shirane, Y. Uesu, K. Fujishiro, and Y. Yamada, "Universal phase diagram for high-piezoelectric perovskite systems," Appl. Phys. Lett., vol. 79, No. 3, pp. 400-402, 2001, doi: 10.1063/1.1384475.
K. J. Choi et al., "Enhancement of ferroelectricity in strained BaTiO3 thin films," Science, vol. 306, No. 5698, pp. 1005-1009, 2004, doi: 10.1126/science.1103218.
M. N. Kamalasanan, S. Chandra, P. C. Joshi, and A. Mansingh, "Structural and optical properties of sol-gel-processed BaTiO3 ferroelectric thin films," Appl. Phys. Lett., vol. 59, No. 27, pp. 3547-3549, 1991, doi: 10.1063/1.105653.
G. H. Jonker and J. H. Van Santen, "Ferromagnetic compounds of manganese with perovskite structure," Physica, vol. 16, No. 3, pp. 337-349, 1950, doi: 10.1016/0031-8914(50)90033-4.
Y. Moritomo, T. Akimoto, A. Nakamura, K. Ohoyama, and M. Ohashi, "Antiferromagnetic metallic state in the heavily doped region of perovskite manganites," Phys. Rev. B, Condens. Matter, vol. 58, No. 9, p. 5544, 1998, doi: 10.1103/PhysRevB.58.5544.
K. Krishnaswamy, L. Bjaalie, B. Himmetoglu, A. Janotti, L. Gordon, and C. G. Van de Walle, "BaSnO3 as a channel material in perovskite oxide heterostructures," Appl. Phys. Lett., vol. 108, No. 8, p. 083501, 2016, doi: 10.1063/1.4942366.
L. Bjaalie, B. Himmetoglu, L. Weston, A. Janotti, and C. G. Van de Walle, "Oxide interfaces for novel electronic applications," New J. Phys., vol. 16, No. 2, p. 025005, 2014, doi: 10.1088/1367-2630/16/2/025005.
S. Bajaj et al., "Density-dependent electron transport and precise modeling of GaN high electron mobility transistors," Appl. Phys. Lett., vol. 107, No. 15, p. 153504, 2015, doi: 10.1063/1.4933181.
J. Khurgin, Y. J. Ding, and D. Jena, "Hot phonon effect on electron velocity saturation in GaN: A second look," Appl. Phys. Lett., vol. 91, No. 25, p. 252104, 2007, doi: 10.1063/1.2824872.
H. J. Kim et. al., "Determination of temperature-dependent thermal conductivity of a BanSnO3-δ single crystal by using the 3 ω method," Thermochimica Acta, vol. 585, No. 10, pp. 16-20, 2014, doi: 10.1016/j.tca.2014.03.036.

* cited by examiner

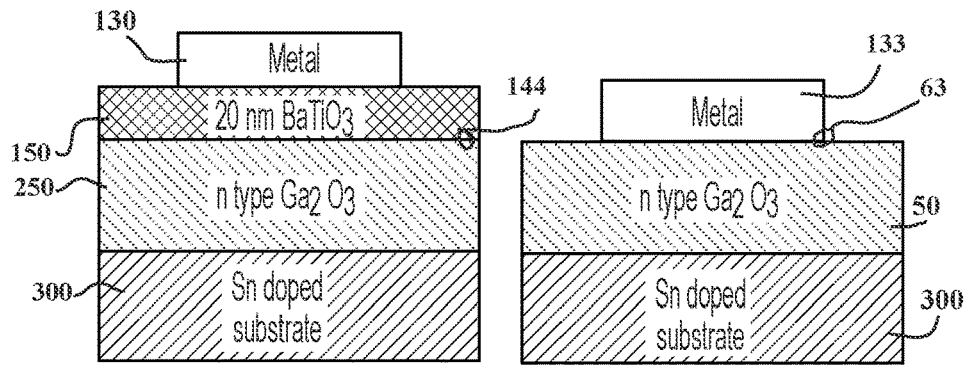
FIG. 9A
FIG. 9B
PRIOR ART
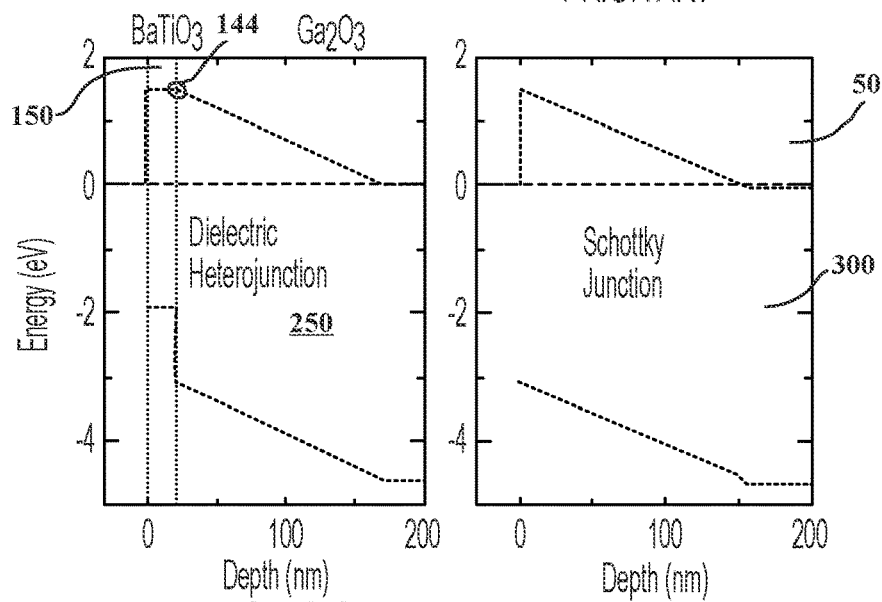
FIG. 9C
FIG. 9D
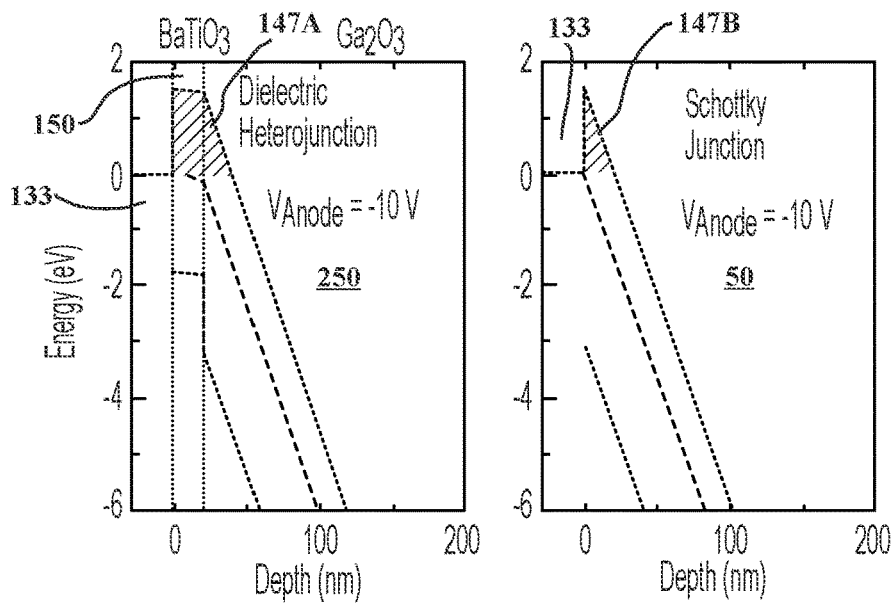
FIG. 9E
FIG. 9F Lateral FET Lateral FET Lateral Schottky diode Lateral PN diode

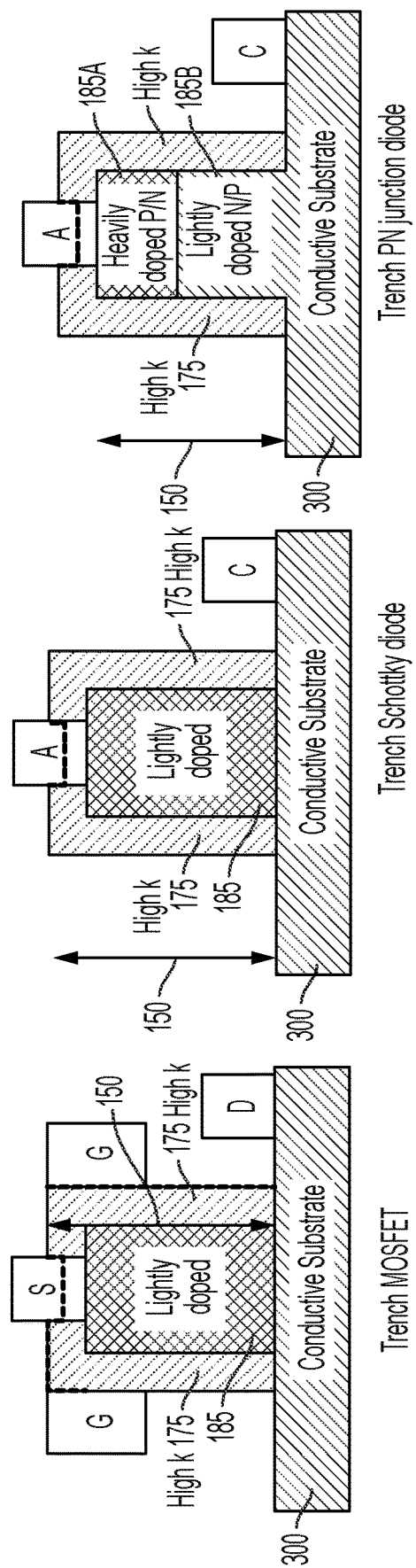

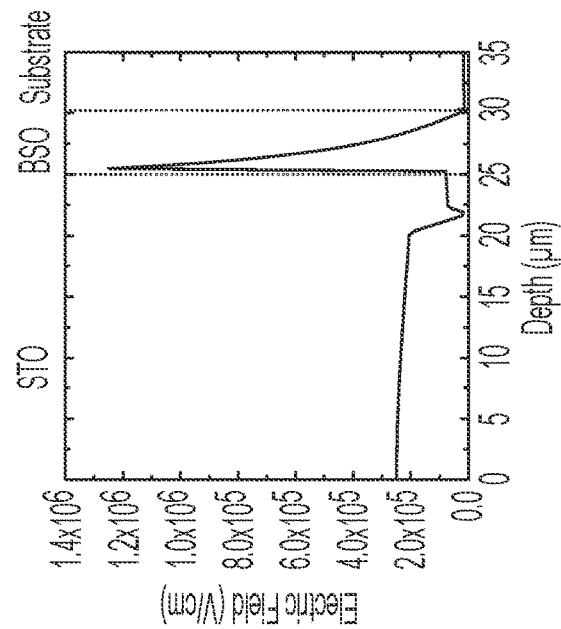
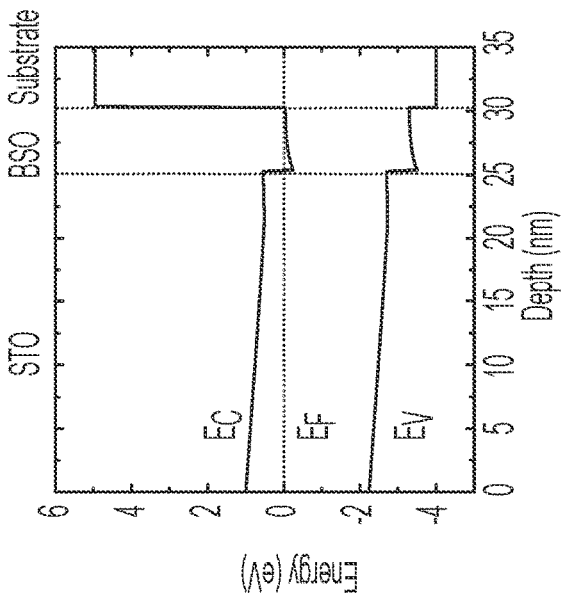
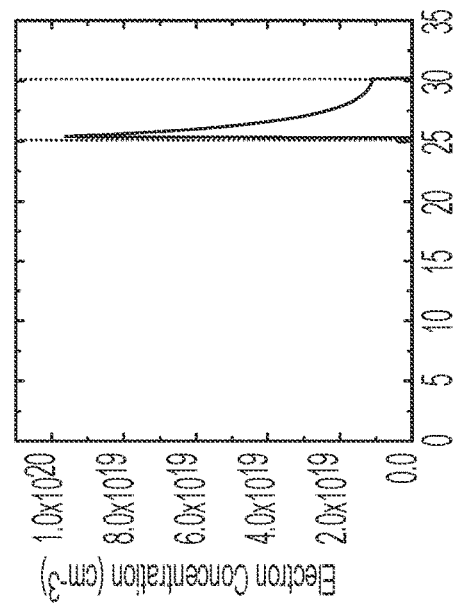
FIG. 22A
FIG. 22B
FIG. 22C

Vg=-2V (pinched off)
Vd=50 V

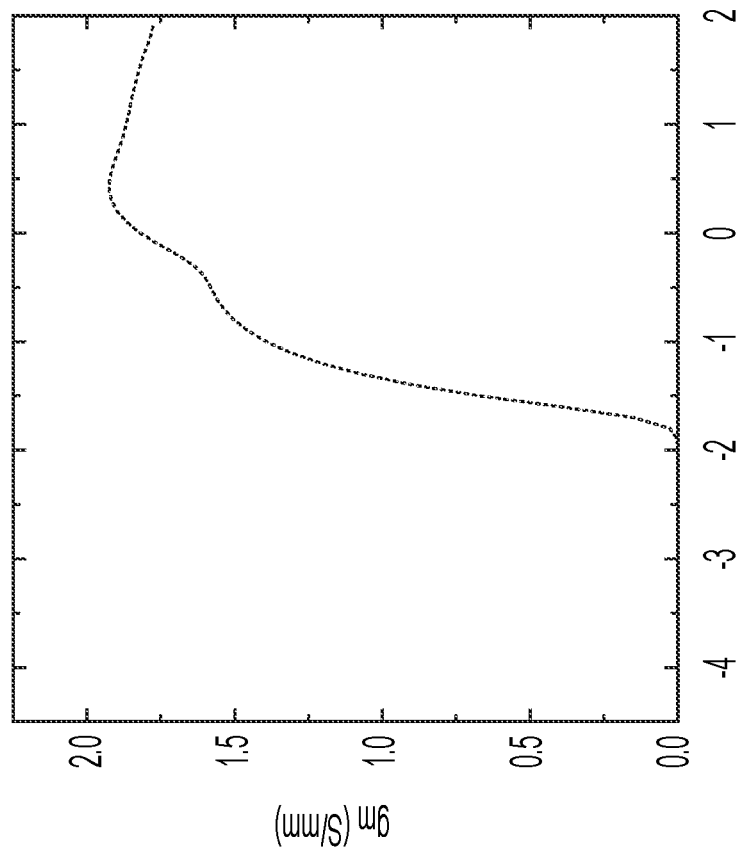
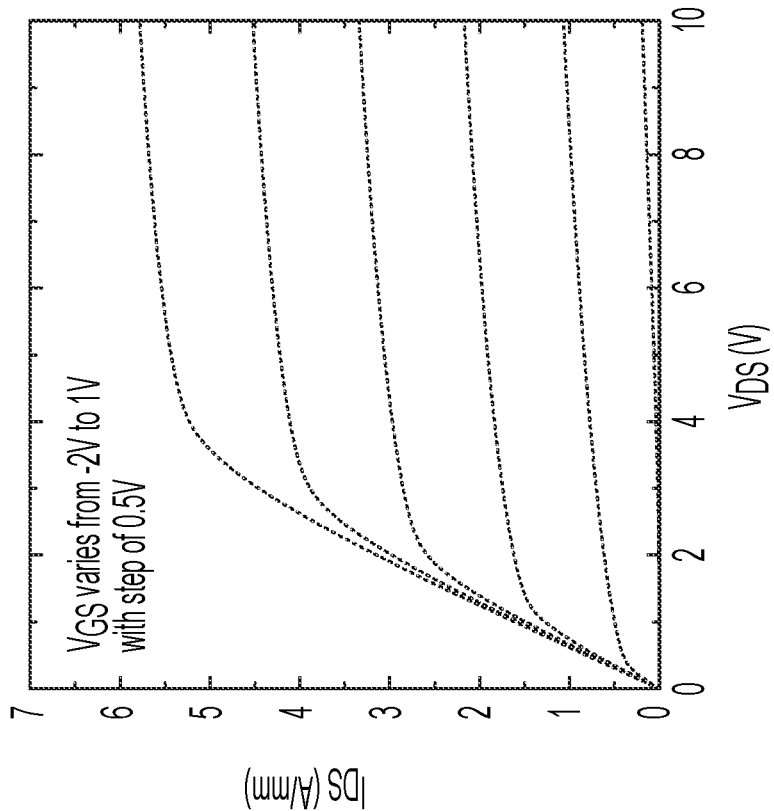
FIG. 24A
FIG. 24B

ELECTRONIC DEVICES WITH ULTRA-HIGH DIELECTRIC CONSTANT PASSIVATION AND HIGH MOBILITY MATERIALS

CROSS REFERENCE TO RELATED APPLICATIONS

This application claims priority to, and the benefit of, U.S. Provisional Patent Application Ser. No. 62/690,493 filed on Jun. 27, 2018, which is incorporated by reference as if set forth fully herein.

STATEMENT REGARDING FEDERALLY SPONSORED RESEARCH

This invention was made with government support under government contract number N00014-18-1-2034 awarded by the Office of Naval Research (ONR). The government has certain rights in the invention.

FIELD

This disclosure relates to solid state electronic devices and hardware components that include layered structures of semiconductors and/or other materials having dielectric constants and related dielectric permittivity values that are engineered to manage electric field positions and electric field magnitudes within the devices.

BACKGROUND

Electronic devices and circuits operating in the millimeter wave (30 GHz-300 GHz) regime are a significant area of technological interest since they can enable a new generation of high throughput, efficient communication networks and sensors. The reduction in breakdown voltage as the operating frequency is increased [1] leads to low power densities at higher frequencies. For example, AlGaN/GaN HEMTs can achieve relatively high-power density in the S- and X-bands (>40 W/mm), but power density at higher frequencies is more challenging to achieve [2]-[4]. At higher operation frequency, the device performance is limited by short channel effect, breakdown field and transit time. The maximum electron density for modulation doping is limited by the conduction band offset ($\Delta E_c$) in the material due to the onset of parallel conduction in the barrier delta-doped layer.

New structures for electronic devices exhibiting higher currents, higher breakdown voltages and flatter field and conduction curves are necessary in the art. A design that can achieve high breakdown voltage on a scaled device with high charge density is required for high-power millimeter-wave device applications.

The conventional approach to improve the breakdown voltage is to use field plates [5]-[7] to manage the field distribution, or to use complementarily doped layers as super-junctions for charge compensation. Achieving the optimal electric field profile using field plates is usually not practically feasible since it requires 3-D shaping of the field plate. Also, field plates increase the gate-drain capacitance and degrade the cutoff frequency devices [8]. Super-junction designs using alternating PN layers have been used for Si devices to surpass the unipolar figure of merit. However, super-junctions introduce great process complexity and are also significantly challenging material systems where p-type doping is less efficient or controllable (such as Group III-nitrides).

SUMMARY

The details of one or more embodiments of the invention are set forth in the accompanying drawings and the description below. Other features, objects, and advantages of the invention will be apparent from the description and drawings, and from the claims.

Semiconductor devices using combinations of ultra-high dielectric constant materials and high-mobility materials exhibit improved electrical response. Extreme dielectric constant mismatch provides several advantages for device design. A high dielectric constant gate barrier can enable high 2D electron gas charge density without parallel conduction, and can mitigate short channel effects. Placing the same high dielectric constant material in the gate-drain depletion region can enable very flat electric field profiles throughout this region. Using detailed 2-dimensional device simulation of DC and high frequency characteristics, this disclosure shows that extreme dielectric constant engineering provides unique opportunities for heterostructure design, and could have the potential to exceed the performance of the state-of-art technology in the mm-wave and THz frequency regimes.

BRIEF DESCRIPTION OF THE DRAWINGS

The accompanying drawings, which are incorporated and constitute a part of this specification, illustrate several aspects of the disclosure, and together with the description, serve to explain the principles of the disclosure.

FIG. 9A is a schematic representation of a layered semiconductor electronic device utilizing the permittivity engineering steps as disclosed herein.

FIG. 9B is a PRIOR ART schematic representation of a layered semiconductor electronic device having a traditional Schottky Junction of the prior art.

FIG. 9C is a band diagram for the device of FIG. 9A.

FIG. 9D is a PRIOR ART band diagram for the device of FIG. 9B.

FIG. 9E is an energy profile showing an electric field profile for the device of FIG. 9A.

FIG. 9F is a PRIOR ART energy profile showing an electric field profile for the device of FIG. 9B.

FIG. 18 is an example embodiment of a trench MOSFET that can be built with a high-k passivation layer as described in this disclosure.

FIG. 19 is an example embodiment of a trench Schottky diode that can be built with a high-k passivation layer as described in this disclosure.

FIG. 20 is an example embodiment of a trench PN junction that can be built with a high-k passivation layer as described in this disclosure.

FIG. 22A is a band diagram for the FET of FIG. 21 at a first set of operating parameters as set forth herein.

FIG. 22B is an electric field profile for the FET of FIG. 21 at a first set of operating parameters as set forth herein.

FIG. 22C is an electron concentration plot according to depth within the FET of FIG. 21 at a first set of operating parameters as set forth herein.

FIG. 24A is a first I-V curve plot for the FET of FIG. 21 at a first set of operating settings for VGS and VDS.

FIG. 24B is a transconductance (g) plot for the FET of FIG. 21 at a first set of operating settings for VGS.

DETAILED DESCRIPTION

Figure 1A:
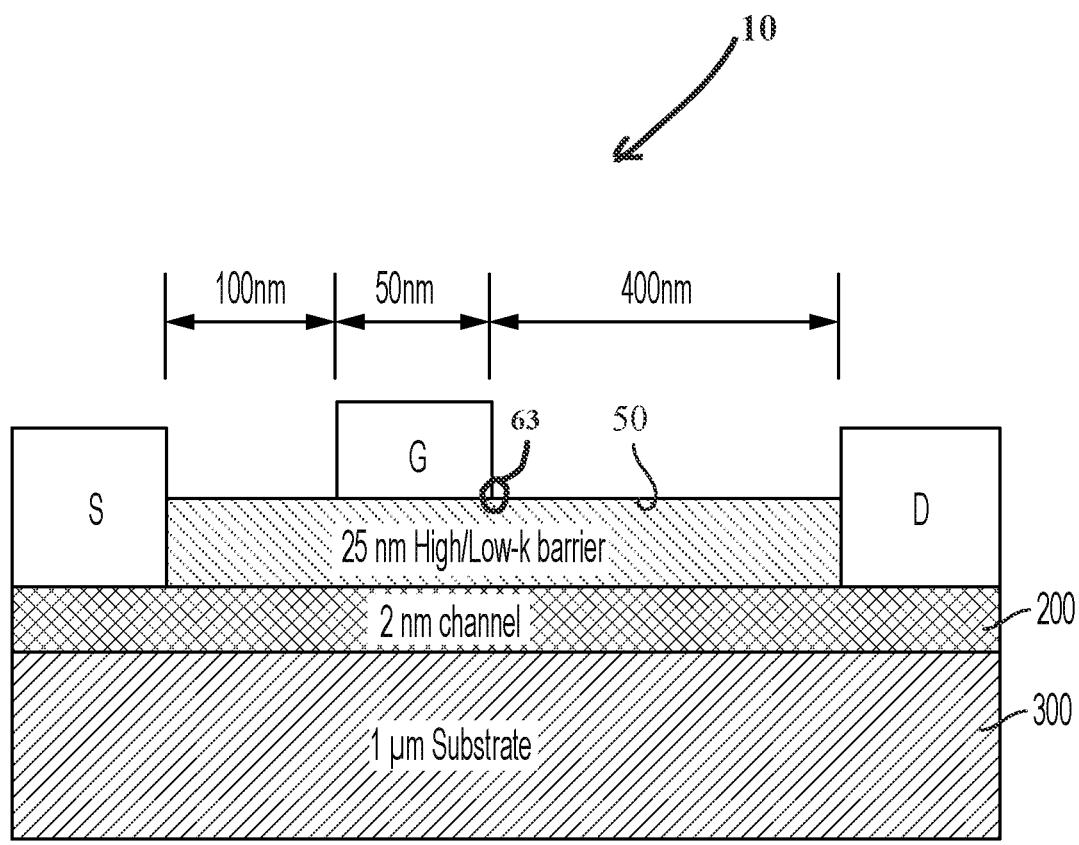
FIG. 1A is a PRIOR ART schematic representation of a field effect transistor (FED) in which the barrier layer can form either a high-permittivity or a low-permittivity barrier in the FET as described herein with dopant charge, gate charge, and dielectric bond charge in gate-drain at OFF-state.

The devices and methods described herein may be understood more readily by reference to the following detailed description of specific aspects of the disclosed subject matter and the Examples included therein.

Before the present devices and methods are disclosed and described, it is to be understood that the aspects described below are not limited to the details of construction and arrangement of components set forth in the following description or illustrated in the drawings. The disclosed technology is capable of other embodiments and of being practiced or carried out in various ways.

In the following description, references are made to the accompanying drawings that form a part hereof and that show, by way of illustration, specific embodiments or examples.

It is also to be understood that the terminology used herein is for the purpose of describing particular aspects only and is not intended to be limiting. In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

The specification makes references to numerous electrical charges of opposite polarity along with collection of certain positive and negative charges on identified hardware. Nothing in this specification limits the disclosure to any one arrangement of positive or negative polarity in circumstances where an opposite polarity may also be arranged.

Definitions

In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "the compound" includes mixtures of two or more such compounds, reference to "an agent" includes mixture of two or more such agents, and the like.

It is understood that throughout this specification the identifiers "first" and "second" are used solely to aid the reader in distinguishing the various components, features, or steps of the disclosed subject matter. The identifiers "first" and "second" are not intended to imply any particular order, amount, preference, or importance to the components or steps modified by these terms.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

This disclosure references electronic device structures in terms of "layers." The term layer is merely descriptive and generally refers any section of the device that has been identified and referenced for a particular part of the disclosure. The term layer is intended to include its broadest possible interpretation and is not limited to any particular shape, size, boundary, delineation, composition or composition change. The scope of the term layer is to be determined by the context of its use herein. Terms such as barrier layer and channel layer are merely descriptive and may or may not have different compositions. A channel layer can be any referenced section or region of an electronic device that conducts a controlled current, typically from source to drain or cathode to anode in any direction. Barrier layers may include any sections of a device that are described by their positions relative to a channel conducting a controlled or desirable current in the device. The barrier layers may also refer to sections of a device that withstand applied voltage conditions without conducting current. In some non-limiting embodiments, a barrier layer may refer to passivation layers described and used herein according to the standard usage in the art of layered electronic devices, including but not limited to passivation layers that provide a desirable electrical, chemical, or physical response on a surface or within a section of an electronic apparatus.

The electronic structures in this case include descriptions of terminals and contacts, including but not limited to anodes, cathodes, gates, drains, sources, and the like. These terms are intended to refer to their broadest possible meanings in accordance with similar structures as commonly used in the art of electronics. The kinds of materials used to form the terminals and contacts are intentionally broad and encompass all present and future materials, positions, doping levels, and other characteristics of terminals and contacts, so long as the technology fits within a given use as discussed herein.

Terms of art are used in this disclosure and shall be given their broadest meaning. For example, a high electron mobility material encompasses all compositions for which the art of electronics typically describes as having a high electron mobility, including but not limited to Group III-V semiconductor compositions with or without additional doping.

This disclosure discusses characteristics of materials in terms of a respective dielectric constant and/or a dielectric permittivity. These terms are used in accordance with standard industry practices in physics and electronics to discuss properties determining how much electrostatic energy, i.e., charge, can be stored per unit of volume in a material subject to a corresponding applied unit voltage. Traditionally, dielectric constants correspond to a relative dielectric permittivity $\varepsilon_r$, and relative permittivity is defined as the permittivity of a given material relative to that of the permittivity of a vacuum. The term "permittivity" herein is generally relative permittivity given the context. Absolute permittivity $\varepsilon_o$ is defined as the measure of permittivity for a material in a vacuum and it is how much resistance is encountered when forming an electric field in the vacuum.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the Figures is turned over, elements described as "below" or "beneath" other elements would then be oriented "above" the other elements. The exemplary terms "below" or "beneath" can, therefore, encompass both an orientation of above and below.

As used herein, the term "adjacent" means an element extends near another element and includes closely spaced apart from, touching and/or overlapping the other element. In contrast, when an element is described as extending "to" or "from" another element, it means the element actually touches or overlaps with the other element, and excludes the elements being spaced apart from one another.

As is known to those of skill in the art, doped and undoped regions of semiconductors may be formed through epitaxial growth and/or through implantation. For example, a p-type region of a semiconductor may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial layer/region" and "implanted layer/region" structurally distinguish differing layers/regions of silicon carbide and may be used herein as a recitation of structural characteristics of the layer/regions of silicon carbide and/or as recitations of methods of forming such layers/regions of silicon carbide.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification, and will not be interpreted in an idealized or overly formal sense unless expressly so defined herein.

Dielectric Super-Junction Field Management

Figure 1B:
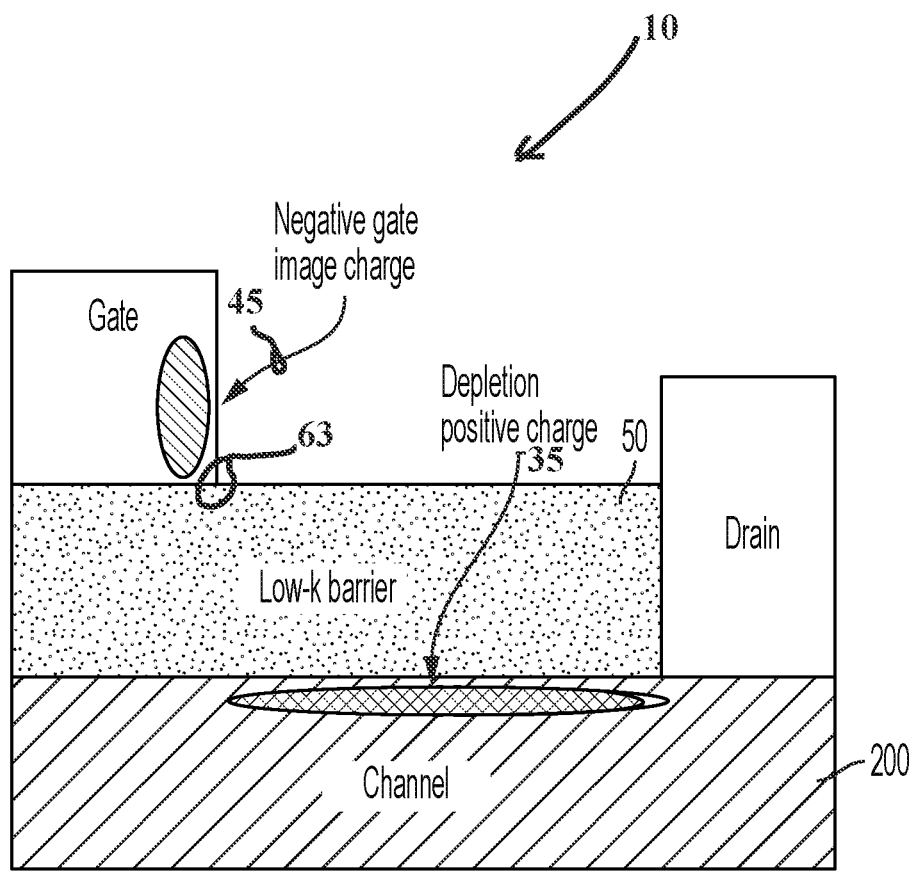
FIG. 1B is a PRIOR ART schematic representation of a normal field effect transistor with a low permittivity barrier layer as set forth herein. There is no dielectric bound charge induced in low k barrier since it has the same permittivity as channel.
Figure 1C:
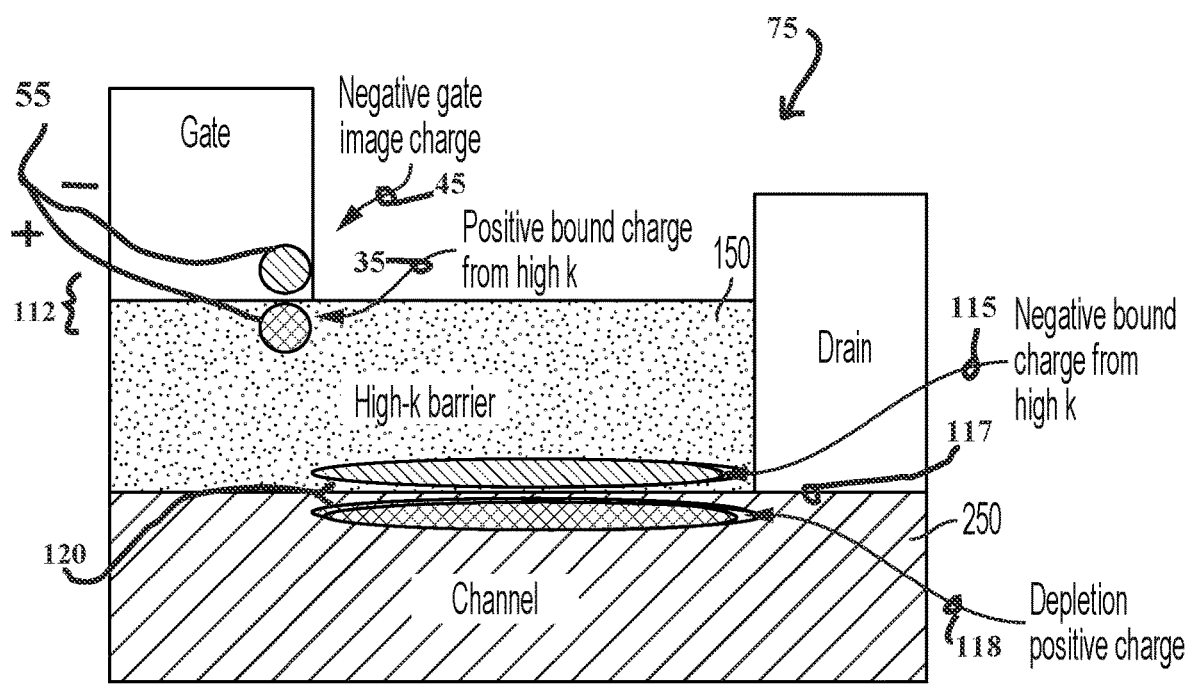
FIG. 1C a schematic representation of a high relative permittivity dielectric super-junction field effect transistor (FET) as set forth herein.

The concept of the dielectric super-junction transistor is illustrated in FIG. 1C. In the gate-drain region of a field-effect transistor (FET) 75 in pinched-off condition, net positive charges 55 are induced in the gate-drain region 112. As shown in FIGS. 1A and 1B, in a conventional FET 10 on a substrate 300 (forming a channel 200 using a low-permittivity layer 50 without a high-permittivity dielectric 150), these positive charges 35 are imaged as negative charges 45 on the gate metal edge 63 on the drain side, and lead to a nonuniform lateral electric distribution with a peak near the gate-drain edge. When a high-permittivity dielectric 150 is introduced, due to large permittivity difference between channel 250 and barrier layer 150, the electric field leads to a gradient in the dielectric polarization in the high-permittivity layer 150 and, therefore, a net negative bound polarization charge 115. The excess net negative polarization bound charges 115 are induced at the high k/low k interface 117 in the depleted region 120. The negative polarization bound charge 115 comes from electric dipole of dielectric material 150 having a high dielectric constant (k). Thus, a net positive polarization bound charge 55 is induced below the drain edge of the gate in the high k barrier layer 150. As a result, the field due to the negative bound charge 115 compensates that from the positive charge 118 in the depletion region near the gate drain edge, reducing the electric field profile, and making the electric field flat. This high-permittivity field management is analogous to a conventional super-junction design where equal number of p- and n-dopants are used to compensate each other, leading to a flat electric field [9], and the breakdown voltage becomes less dependent on the sheet charge density. Kabemura et al. [10] is a later publication of work related to this concept as well.

To quantitatively estimate the potential of such devices, one must consider high-permittivity, high breakdown strength materials such as perovskite oxides BaTiO3 and SrTiO3. Since these materials have relatively low room temperature mobility (<10 cm2/V·s), this disclosure investigates devices that use combinations of these materials with higher mobility materials. Integration of perovskite oxides with conventional semiconductors is possible, either in crystalline form through epitaxy on GaAs or Si, or in polycrystalline from sputtering. In this paper, the disclosure shows epitaxial integration of high-permittivity oxides with a high mobility perovskite oxide BaSnO3 [11]-[15]. BaSnO3 is a wide bandgap (E.g. =3.2 eV) [16], [17] semiconductor with a relatively low-conduction band effective mass (0.2 me) [18] and reported mobility up to 300 cm2N·s5. A range of oxide materials that have unique properties including ultrahigh dielectric constant [19]-[22], piezoelectricity [23], ferroelectricity [24], [25], ferromagnetism [26], and anti-ferromagnetism [27] can, therefore, be integrated on a material platform with excellent electron transport properties.

Figure 2A:
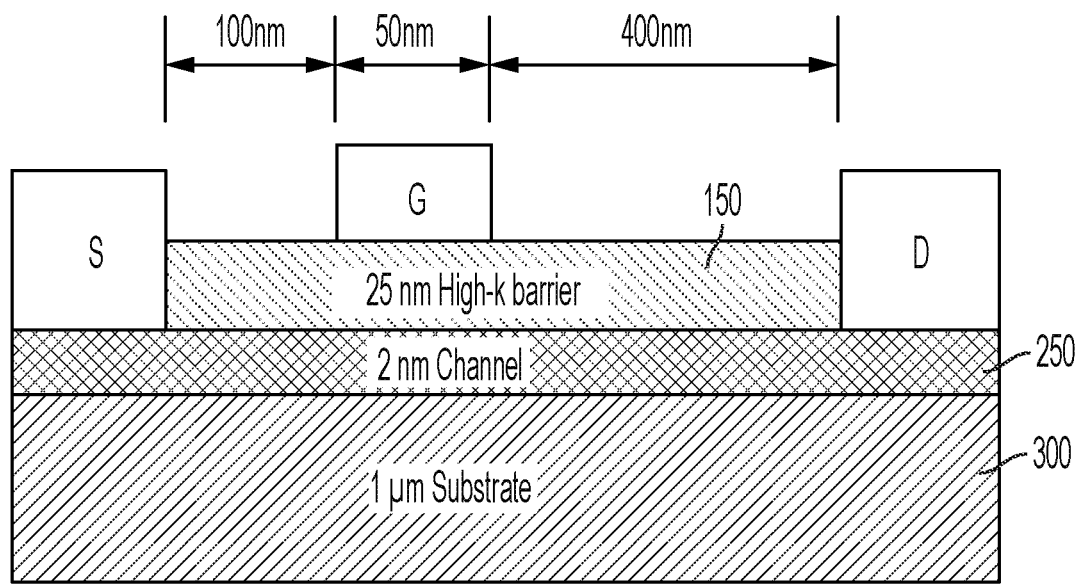
FIG. 2A is a schematic representation of a dielectric super-junction transistor according to this disclosure.
Figure 2B:
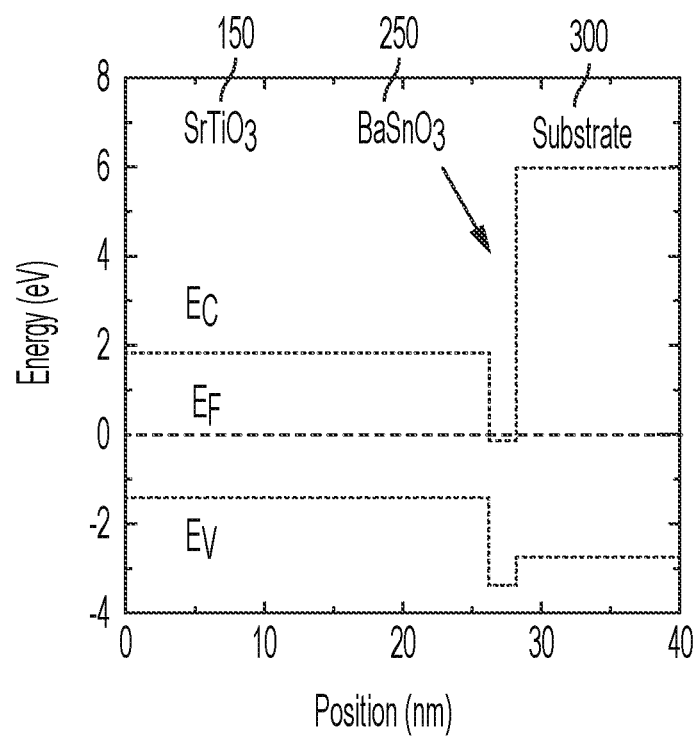
FIG. 2B is a band diagram for the transistor of FIG. 2A according to this disclosure.
Figure 3A:
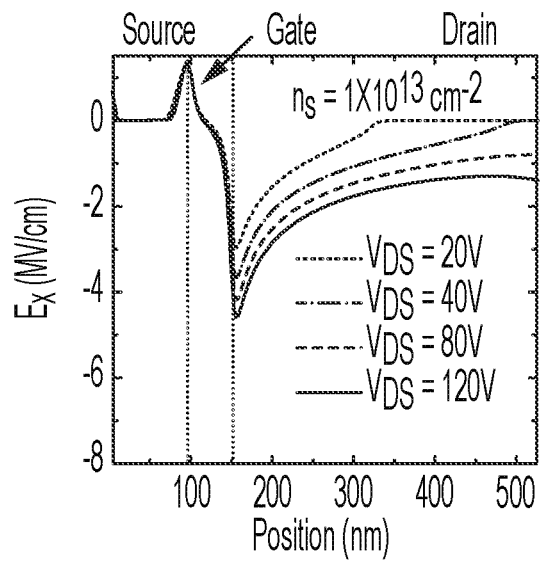
FIG. 3A is a schematic view of an OFF-state electric field profile in BaSnO3 channel from source to drain with (a) low-permittivity barrier layer with $1 \times 10^{13}$ cm$^{-2}$ channel charge density, as set forth herein.
Figure 3B:
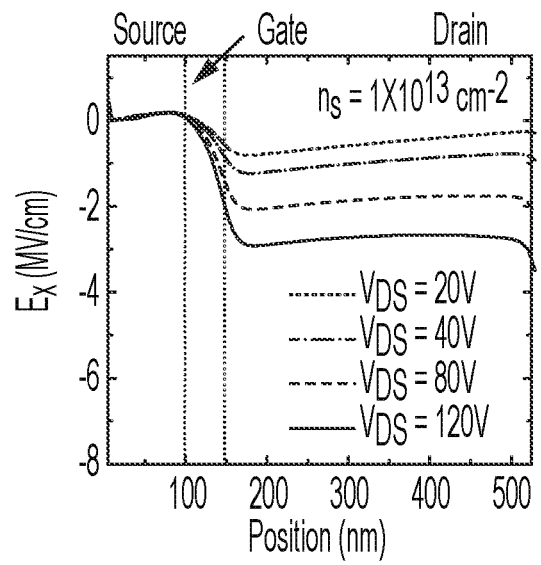
FIG. 3B is a schematic view of an OFF-state electric field profile in BaSnO3 channel from source to drain with a (b) high-permittivity barrier layer with $1 \times 10^{13}$ cm$^{-2}$ channel charge density as set forth herein.
Figure 3C:
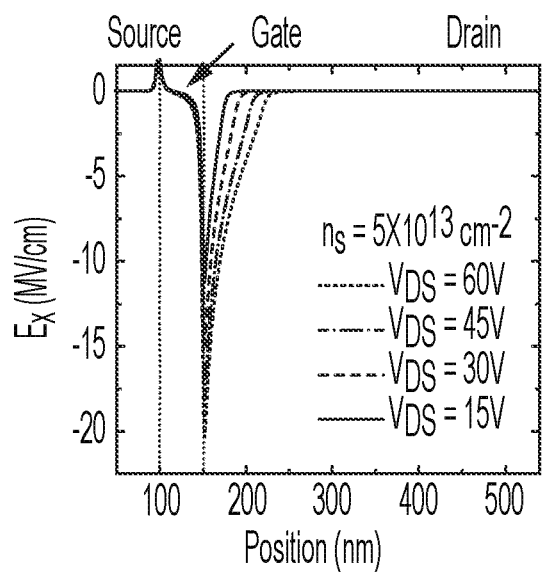
FIG. 3C is a schematic view of an OFF-state electric field profile in BaSnO3 channel from source to drain with a (c) low-permittivity barrier layer with $5 \times 10^{13}$ cm$^{-2}$ channel charge density.
Figure 3D:
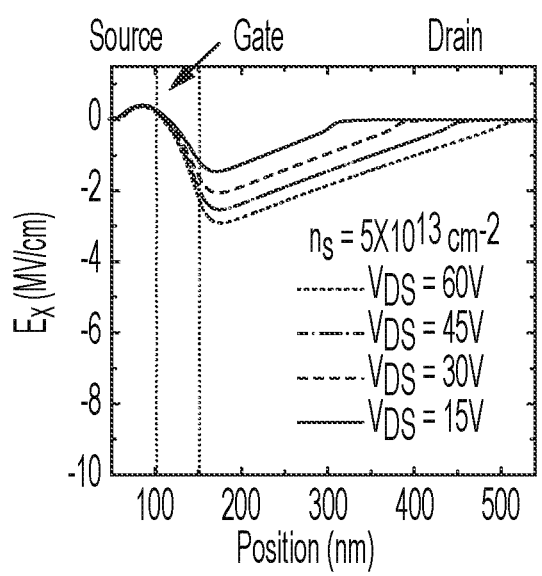
FIG. 3D is a schematic view of an OFF-state electric field profile in BaSnO$_3$ channel from source to drain with high-permittivity barrier layer with $5 \times 10^{13}$ cm$^{-2}$ channel charge density.

Device simulations were performed using a 2-D device simulator Silvaco. A schematic of a SrTiO3/BnSnO3 heterostructure is shown in FIG. 2(a) [28]-[30]. The material constants assumed for these simulations are shown in Table I. A range of sheet charge density from $1 \times 10^{13}$ cm−2 to $5 \times 10^{13}$ cm−2 was introduced. The energy band diagram with $5 \times 10^{13}$ cm-2 channel charge density is shown in FIG. 2(b). A control structure with SrTiO3 replaced with low-permittivity barrier material ($\varepsilon_r=10$) was also simulated. Contact resistance 0.1 ohm·mm is assumed.

TABLE I

MATERIAL PARAMETERS

| Material | SrTiO$_3$ | BaSnO$_3$ |
|---|---|---|
| Band gap (eV) | 3.2 | 3.2 |
| Dielectric constant | 350 | 25 |
| Effective mass | 1.8 | 0.2 |
| Electron mobility (cm$^2$/Vs) | 10 | 300 |
| Saturation velocity (cm/s) | $1.4 \times 10^7$ | $1.4 \times 10^7$ |

The OFF-state breakdown scenarios were simulated for both structures. Negative gate bias was applied to pinch-off the device and drain bias and lateral electric field in channel region was extracted as shown in FIG. 3. The low-permittivity barrier devices of FIGS. 3A and 3C have a large peak lateral field at gate edge on the drain side. As channel charge density increasing from $1 \times 10^{13}$ cm$^{-2}$ to $5 \times 10^{-13}$ cm$^{-2}$, the drain depletion region becomes shorter and peak electric field rise significantly. On the other hand, the dielectric super-junction transistor showed nearly uniform electric profile at a charge density of $1 \times 10^{13}$ cm$^{-2}$.

Figure 4:
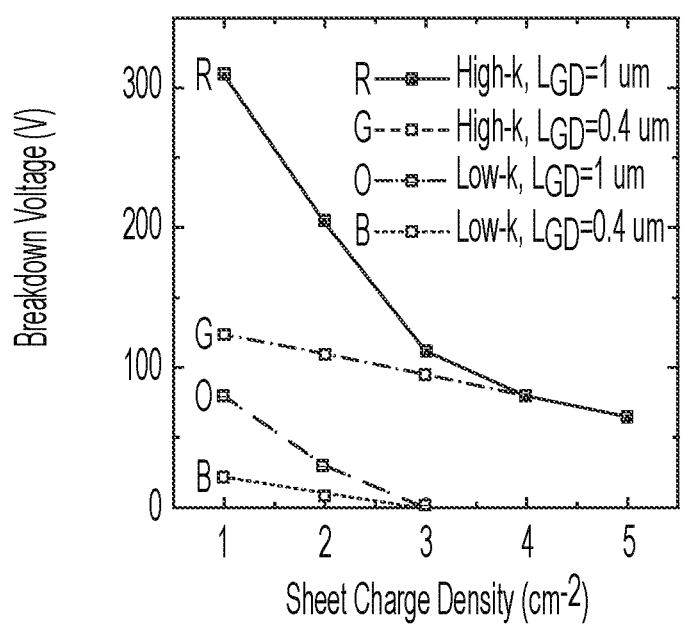
FIG. 4 is a graphical display of breakdown voltage versus charge density for different gate-drain spacing in transistors as set forth herein.

For $5 \times 10^{13}$ cm$^{-2}$ channel charge case, the shape of the electric field is triangular, but the peak field is much lower than low-permittivity barrier device. Breakdown field of 3 MV/cm was assumed and the breakdown voltages for devices with various charge density and gate-drain distance are summarized in FIG. 4. For $1 \times 10^{13}$ cm$^{-2}$ channel charge device, the dielectric super-junction transistor 75 has four times higher breakdown field. At extremely high sheet charge density, the low-permittivity structure 10 has electric fields exceeding the breakdown field at a gate-drain bias of 8 V. The dielectric super-junction transistor 75 would be expected to have a significantly higher gate-drain breakdown voltage of 60 V. Therefore, for a given breakdown voltage, the high-permittivity barrier enables higher charge density, and consequently, higher current density than conventional transistor designs.

Figure 5A:
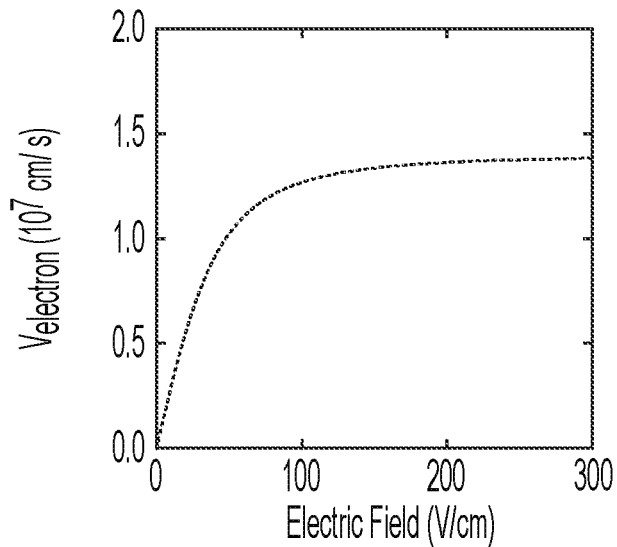
FIG. 5A is a graphical display of current (I)-voltage (V) characteristics of an electronic device in the form of a SrTiO3/BaSnO3 MODFET as disclosed herein.
Figure 5B:
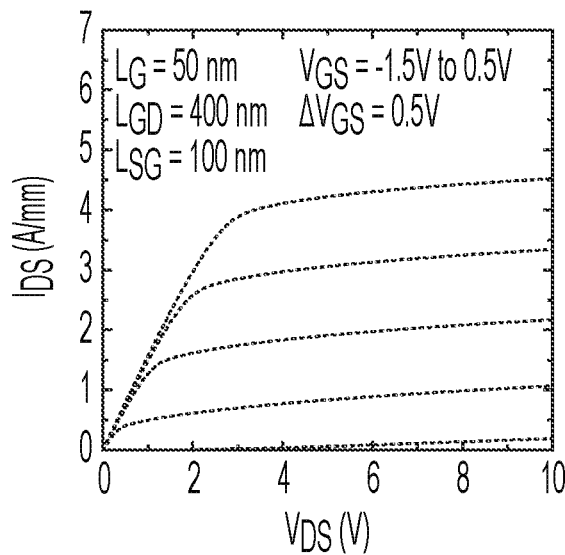
FIG. 5B is a graphical display of transconductance of a SrTiO3/BaSnO3 MODFET as disclosed herein.

The electron mobility in doped BaSnO3 channels for a density of 1020 cm-3 can be as high as 150 cm2N·s7. Therefore, it is possible to get high sheet charge density while at the same time maintaining excellent mobility. FIG. 5 shows the simulated output and transfer characteristics. In the simulations described here, electron mobility of 300 cm2/V·s was assumed, which matches measured electron mobility in bulk layer of BaSnO3. A high current of over 4 A/mm was achieved, assuming a saturated electron velocity of $1.4 \times 10^7$ cm/s. The saturated velocity for BaSnO3 is not known, therefore, to enable benchmarking, this disclosure used the typical values for GaN [31], [32]. When a drain voltage is applied, the gate-drain region depletes to support the voltage. However, having a layer of high dielectric constant SrTiO3 on the surface suppresses the field significantly, so that the maximum field at a voltage of 60 V (as shown in FIG. 5) is below 3 MV/cm (FIG. 3). Therefore, based on device simulations, the models herein can predict breakdown voltage of 60 V, with a current density over 4 A/mm.

Figure 6:
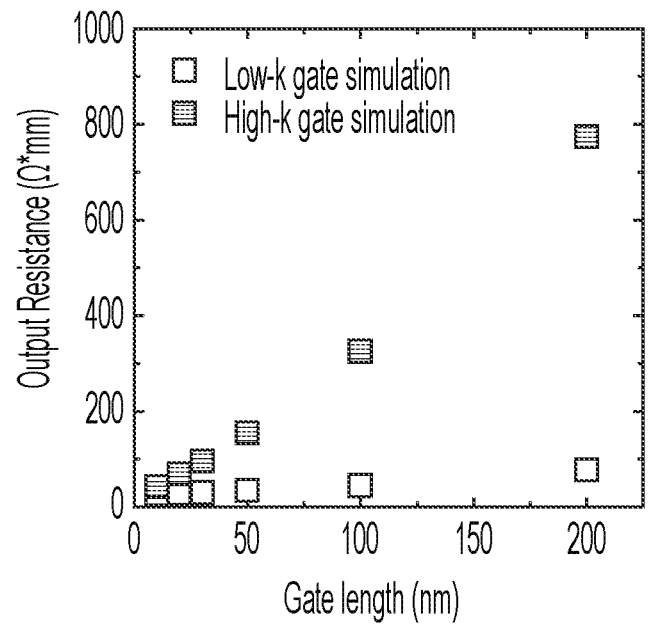
FIG. 6 is a graphical display of output resistance versus gate length for a dielectric superjunction FET and low k gate dielectrics as disclosed herein.

A secondary, but important consequence of high dielectric permittivity under the gate, is that they lead to scaling of the gate to channel distance, enabling very low output conductance and high transconductance. I-V characteristics of the structure shown in FIG. 1 with high-permittivity and low-permittivity barrier were simulated for various gate length from 10 to 200 nm. The output conductance values extracted at VG=0V are shown in FIG. 6. The output resistance of the dielectric super-junction transistor is more than six times higher than the one with low-permittivity barrier for all gate lengths.

Figure 7B:
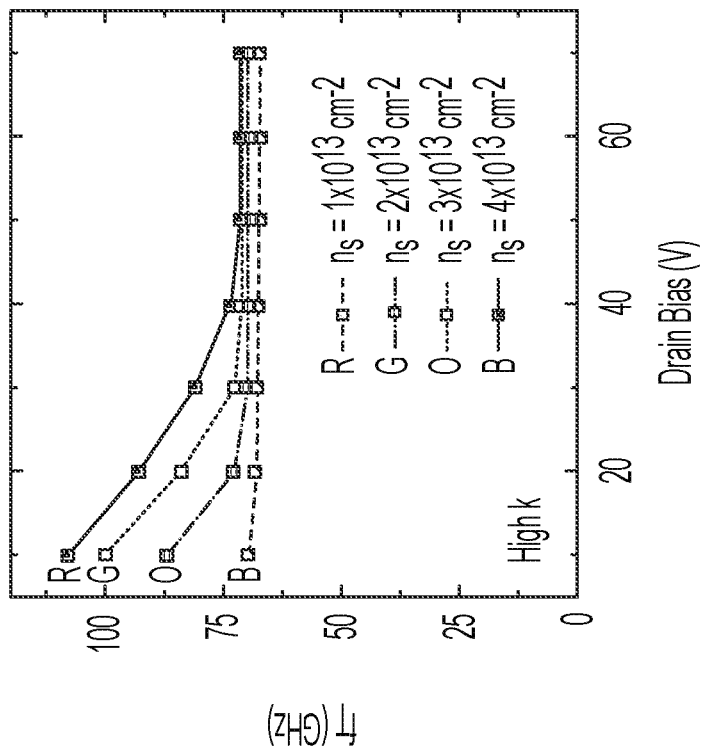
FIG. 7B is a graphical display of small signal RF characteristics of (b) a high-permittivity barrier FET with Lgd=400 nm as disclosed herein.
Figure 7A:
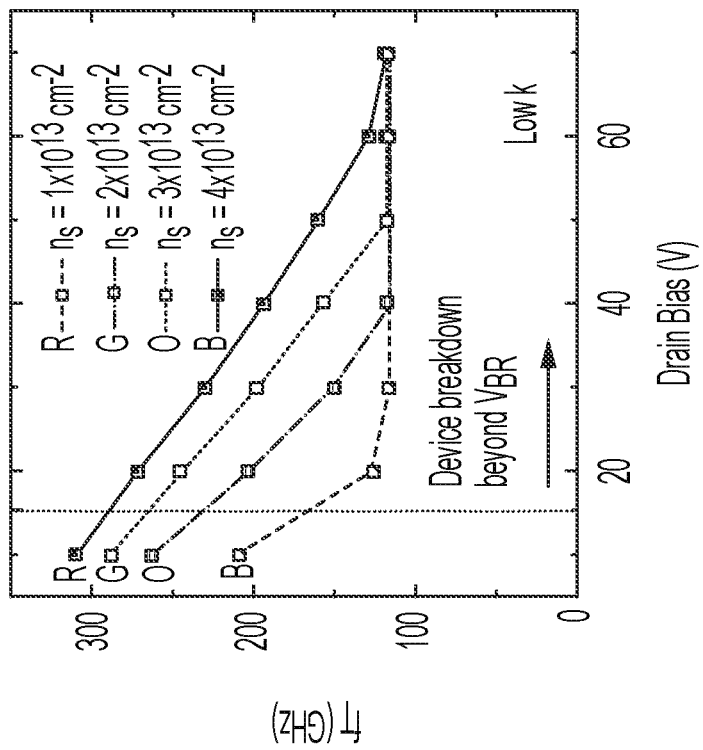
FIG. 7A is a graphical display of small signal RF characteristics of (a) a low-permittivity barrier FET with Lgd=400 nm as disclosed herein.

Small signal characteristics for dielectric super-junction transistor were simulated and the cutoff frequency at various drain bias is plotted in FIG. 7. A normal FET with low-k barrier was also simulated as a control case. For low-k barrier device with $1 \times 10^{13}$ cm-2 channel charge, the peak current gain cutoff frequency (fT) at VD=10 V was calculated to be 210 GHz, which is similar to experimental reports of AlGaN/GaN HEMT with similar device dimension. This is expected since this disclosure shows the typical effective velocity seen in AlGaN/GaN HEMTs for the simulation. As higher drain bias applied, long drain depletion region is created which causes large drain delay. When drain bias is above 20 V, the drain depletion region reaches the drain terminal and the fT approaches 125 GHz. For the device with higher channel charge density, the shorter drain depletion region is induced by the same bias, so it can achieve a higher peak cutoff frequency. However, the breakdown voltage for the low-k barrier device is below 25 V, so operation above 25 V is not feasible.

The dielectric super-junction transistor 75 has a longer drain depletion region than the low-k case and higher gate to channel capacitance due to the high-permittivity region between the gate and drain. Thus, the peak cutoff frequency is lower than low-k barrier device. The thickness (t) of the high-permittivity region is critical to manage the tradeoff between field management and gate-drain capacitance.

Figure 8:
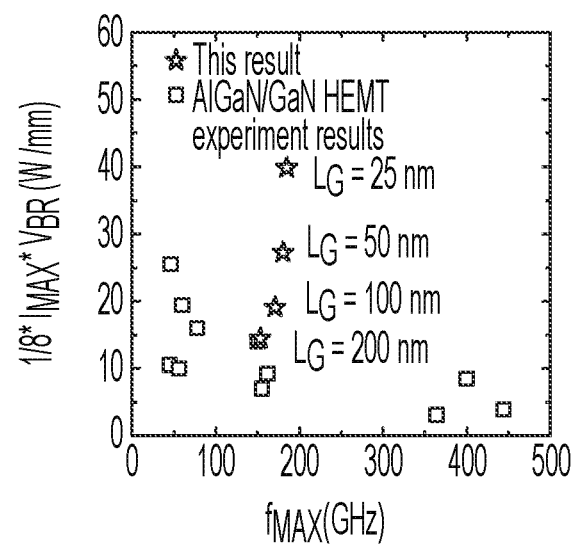
FIG. 8 is a graphical representation of IMAX×VBR and fMAX comparison of SrTiO3/BaSnO3 dielectric superjunction FETs with different gate lengths and state-of-the-art GaN high electron mobility transistors (HEMTs) as disclosed herein.

FIG. 8 shows the nominal class A output power density, IMAX×VBR/8 as a function of fMAX. The state-of-the-art GaN HEMT results are also shown. At fMAX=180 GHz, a conventional FET is expected to achieve a peak power density of 7 W/mm, while the dielectric super-junction transistor can reach 40 W/mm Table II summarizes the simulated device performance Based on estimates of the maximum current and breakdown voltage, and assuming an operating frequency where the transistor would have sufficient power gain (in this case up to ~30 GHz), these materials estimate the maximum power density of the device to be over 30 W/mm

TABLE II

SIMULATED DEVICE PARAMETERS

| Parameter | Simulated |
| --- | --- |
| Current density | 4 A/mm |
| Breakdown voltage | 60 V |
| Max power density (class AB) | >30 W/mm |
| Cutoff frequency | 90 GHz |
| Max Oscillation frequency | 180 GHz |
| PAE (estimated) | >50% |

In addition to the high breakdown voltage-current density product enabled by these materials, there are several other advantages that make them promising for RF operation. The high dielectric constant of BaSnO3 (2× higher than conventional semiconductors) leads to higher breakdown strength and can, therefore, enable higher power density than a material with similar energy bandgap. SrTiO3/BaSnO3 heterostructures can enable very high sheet charge density in the access regions to enable ultralow access and contact resistance, and mitigate source-region pinch-off to realize highly linear transconductance. Finally, the high hole effective mass in (Ba,Sr)SnO3 could enable higher breakdown strength by reducing inter-band tunneling. BaSnO3 has a thermal conductivity of 13 W/(m·K) [33] which is $\frac{1}{10}$ of the value of GaN. Therefore, self-heating will play a very important role even at low power densities. When compared with state-of-the-art GaN on SiC technology, this is a significant drawback if high power density is needed. However, the use of high-permittivity barriers is not limited to perovskite oxides and is applicable for other material systems such as AlGaN/GaN HEMTs that have excellent transport and thermal properties.

The concept of dielectric super-junction described here can be extended to several other device applications and material systems. They can be used to increase the sheet charge density in power switching transistors, and therefore, help to reduce the ON-resistance for a given breakdown voltage. While the structures discussed here focused on epitaxial integration of perovskite oxides, it may also be possible to integrate high dielectric constant materials with conventional semiconductors such as Si, GaAs, GaN, and with layered 2-D semiconductors to enhance power switching and high-frequency devices based on these materials. The introduction of high dielectric constant in the gate-drain region can also have significant consequences for other device characteristics such as linearity. In conventional devices, the gate-drain extension changes with the applied drain bias, leading to the variation of current and power gain with the drain bias. This can impact the large signal linearity of the device. Using high dielectric constant materials lead to almost constant drain-side depletion and capacitance and could, therefore, enable power and current gain to be almost independent of the drain voltage. This could have important consequences for transistor linearity and gain compression, both of which are of great importance for communication systems.

FIGS. 9A-9F illustrate another comparative example of a dielectric with high relative permittivity in a super-junction in a barrier layer of FIG. 9A. In this example, a FET 75 includes a metal contact 130 is directly atop a high permittivity passivation layer 150 on a lower permittivity channel layer 250 on a substrate 300. FIG. 9B shows a traditional device 10 (metal contact 133, low permittivity layer 50, substrate 300) without the high-k and low-k intersection 144 of FIG. 9A. FIGS. 9C-9F illustrate the band diagrams and energy profiles for the devices. As shown in FIGS. 9C and 9E, the electric field 147A in the superjunction of FIG. 9A is spread into the barrier layer 150, while the Schottky junction of FIGS. 9D and 9F have high field effects 147B at the drain edge 63 of the metal contact 133. FIG. 9C illustrates how the dielectric heterojunction 144 (high k-low k interface) of the barrier layer 150 with a high dielectric constant and the channel layer 250 with a lower dielectric constant exhibit higher and better controlled conduction in the channel layer 250 as shown in FIGS. 9C and 9E.

Figure 10:
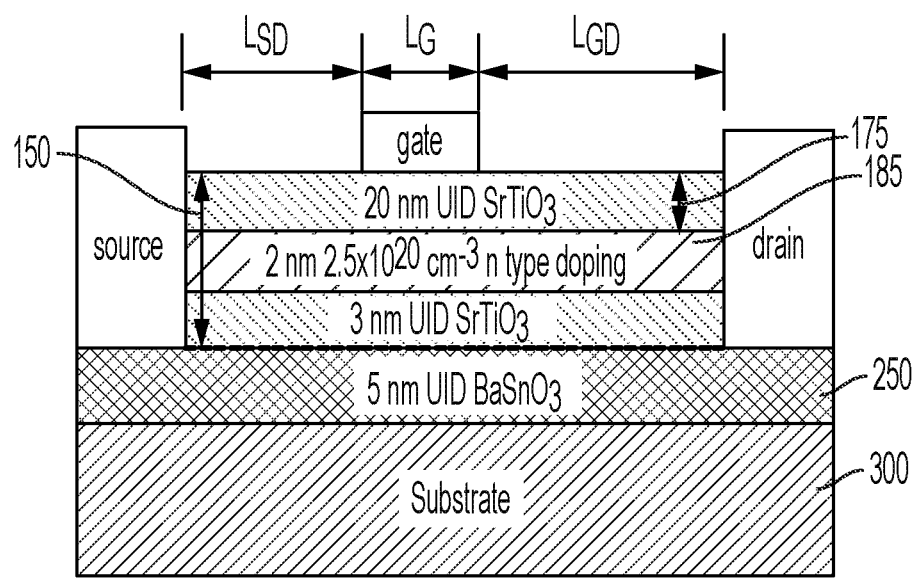
FIG. 10 is a schematic illustration of a three terminal transistor utilizing the high dielectric permittivity barrier layers as disclosed herein.
Figure 11A:
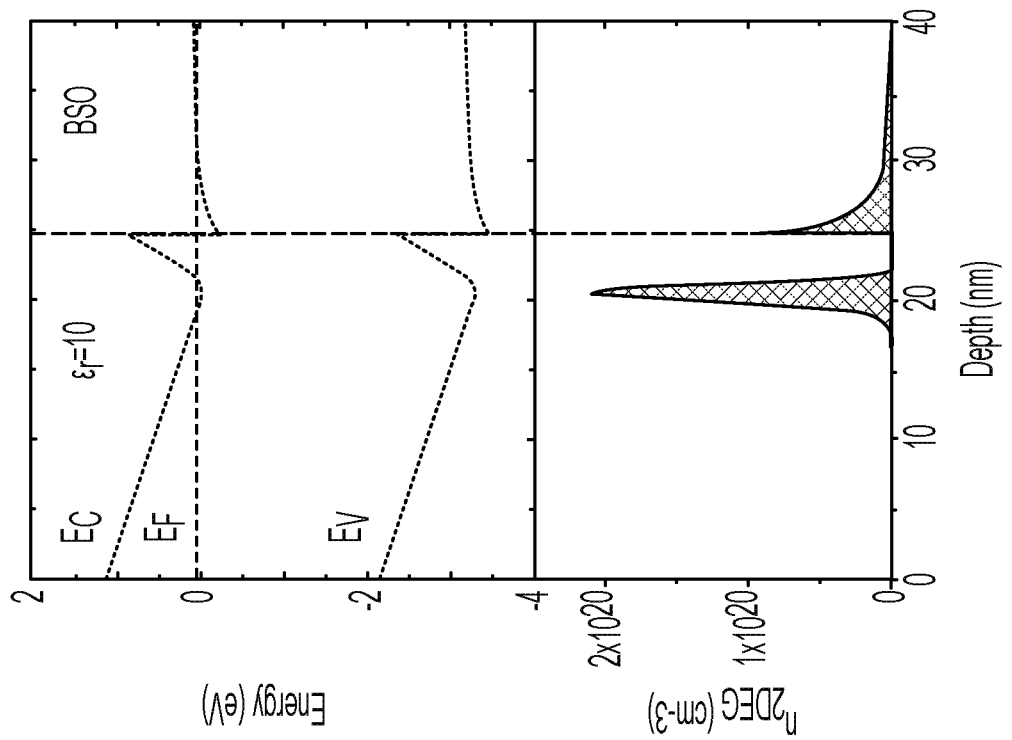
FIG. 11A is a band diagram for the device of FIG. 10 as disclosed herein.
Figure 11B:
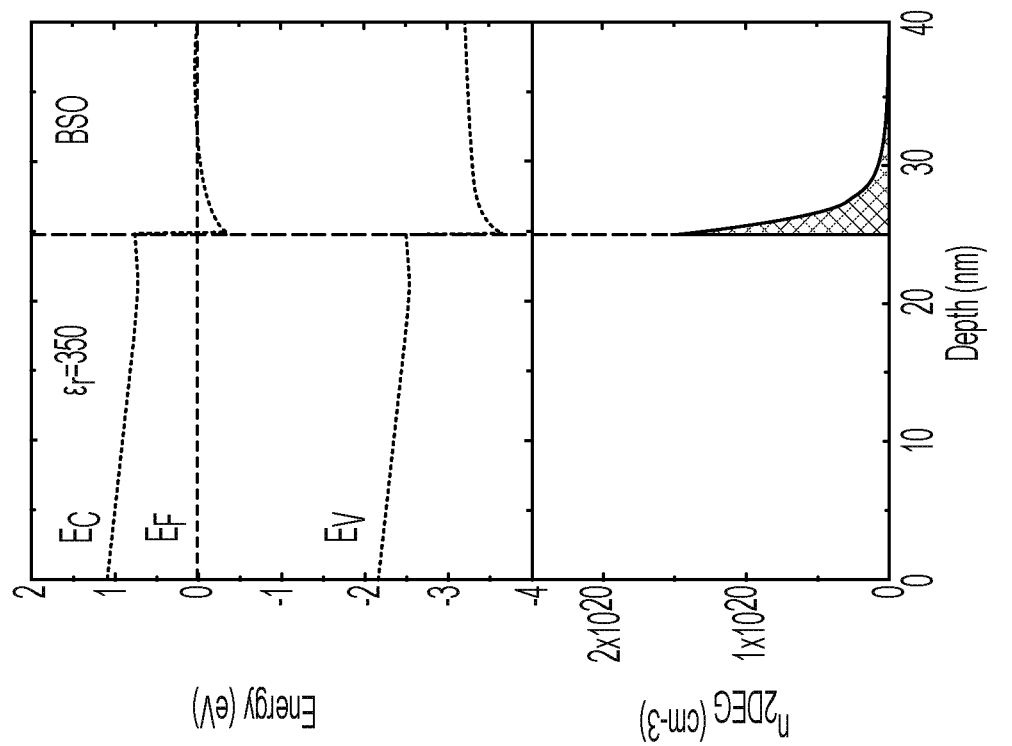
FIG. 11B is a charge profile for the device of FIG. 10 as disclosed herein.
Figure 12B:
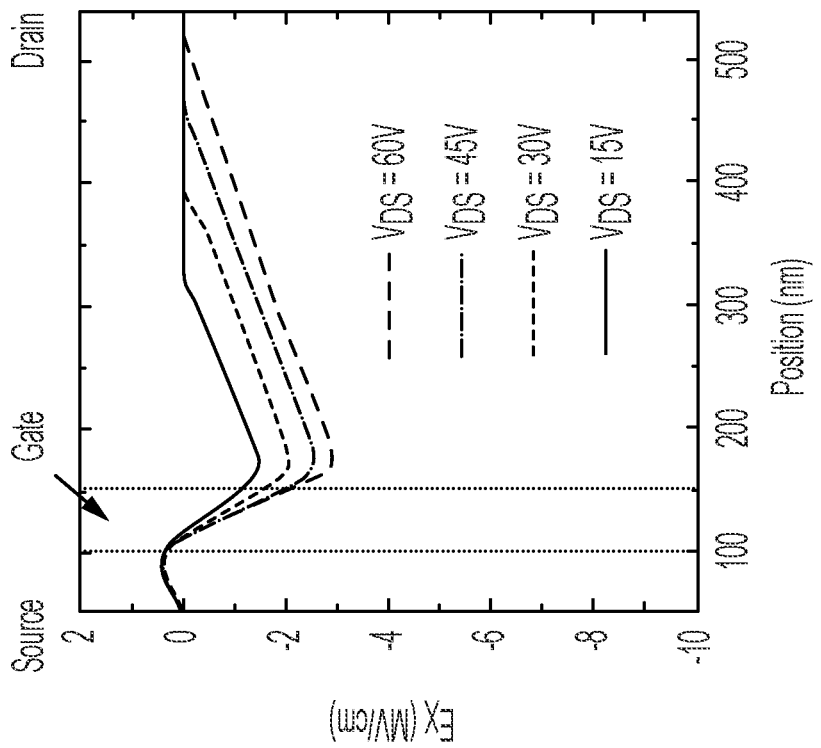
FIG. 12B is a field profile for a device with a high permittivity dielectric super junction as described herein and exhibiting higher breakdown voltage and flatter field curves as disclosed herein.
Figure 12A:
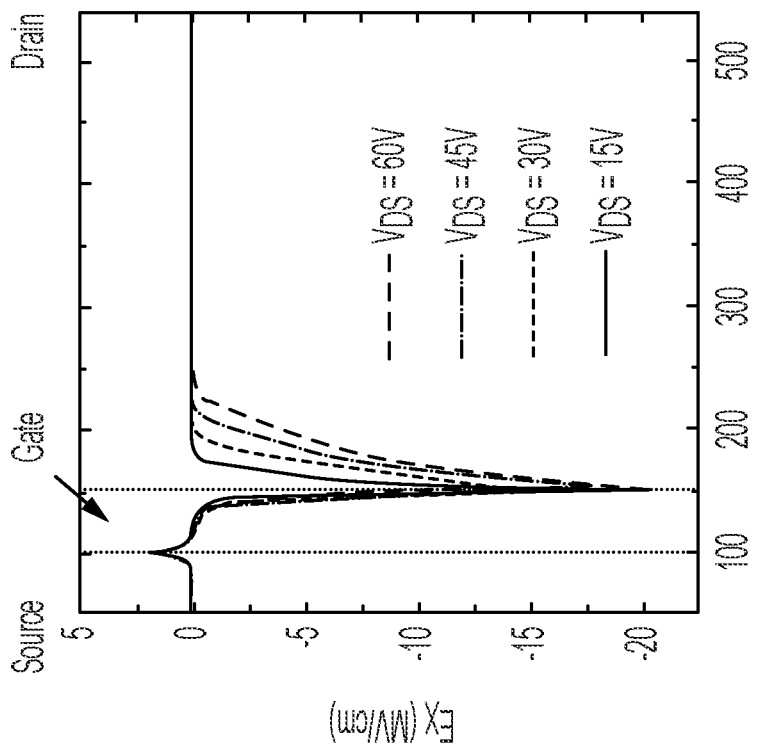
FIG. 12A is a PRIOR ART field profile for a device without a high permittivity dielectric super junction as described herein.
Figure 13:
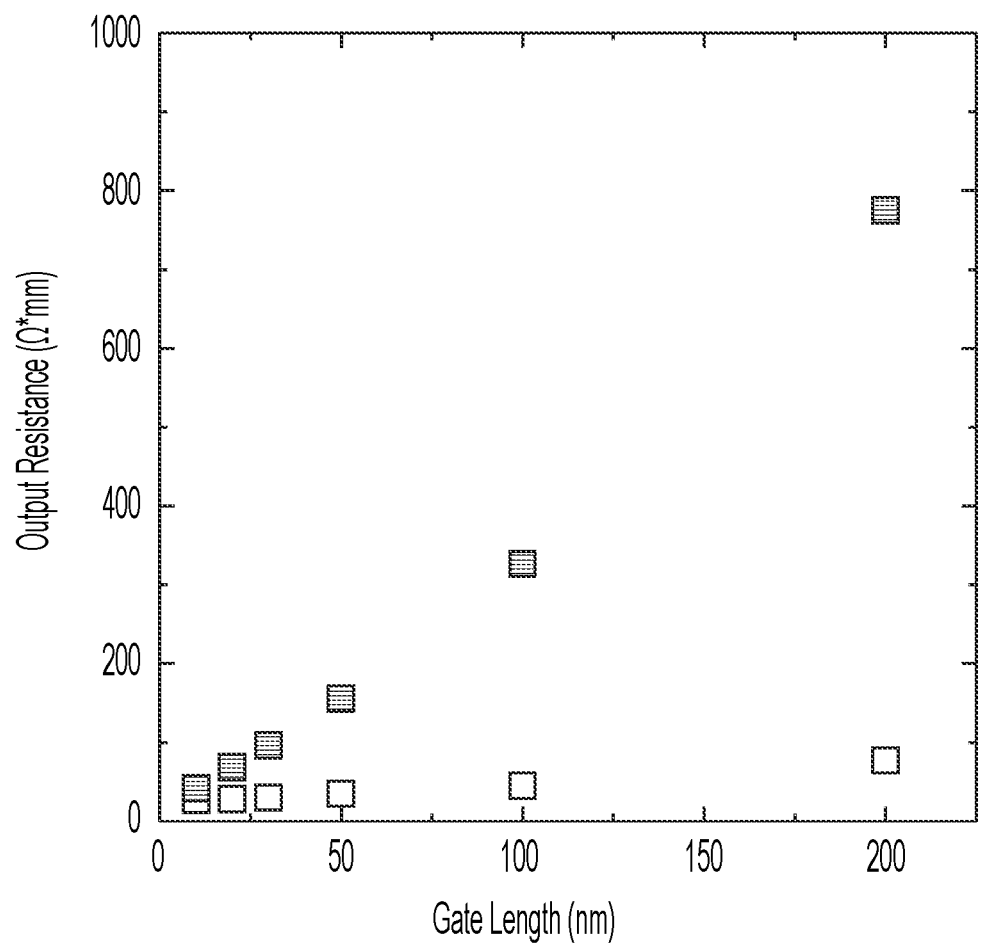
FIG. 13 is a graphical plot of output resistance values for low-dielectric constant "k" (circled) and high-dielectric constant "k" barrier layers at numerous gate lengths, showing that the output resistance of a heterojunction field effect transistor (HFET) with a high-k barrier is more than six times higher than one with low-k barrier for all gate lengths.

Embodiments of electronic devices illustrated herein may also incorporate overall barrier layers 150 with internally doped regions 185 between the channel 250 and a junction portion 175 of a barrier layer 150. In this embodiment, shown in FIG. 10, the junction portion 175 is a high dielectric permittivity layer as disclosed above. FIGS. 11-13 show the operating results in terms of band diagrams and charge distribution of a high k-low k heterojunction FIG. 11A and a different structure in which the barrier layer 150 does not have such a high dielectric constant. The position of charge in the channel layer of FIG. 11A is significant in achieving the high current in the channel. FIGS. 12A and 12B illustrate how much more effective the high-k/low k super junction of FIG. 12B is in allowing a higher breakdown voltage in the device with better controlled current in the channel. Under other operating conditions, FIG. 13 shows the above noted increase in output resistance for devices that incorporate a high dielectric constant barrier or passivation structure when the associated proximate layers, such as a channel layer, are formed of lower dielectric constant materials. In FIG. 13, the super-junction described herein exhibits a six fold increase in output resistance for all gate lengths.

Figure 14:
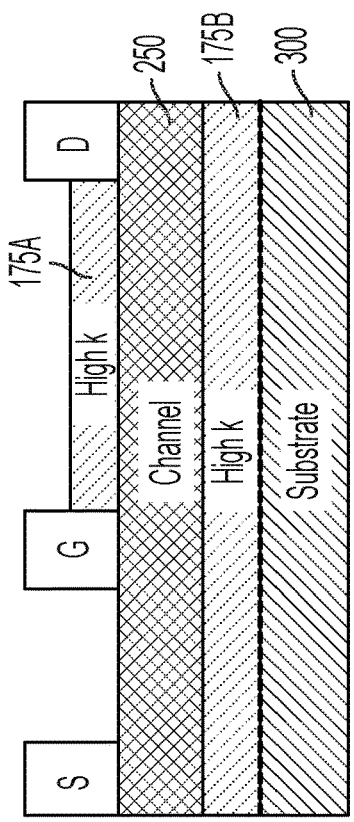
FIG. 14 is an example embodiment of a lateral field effect transistor structure that can be built with a high-k passivation layer between the gate and drain as described in this disclosure.
Figure 15:
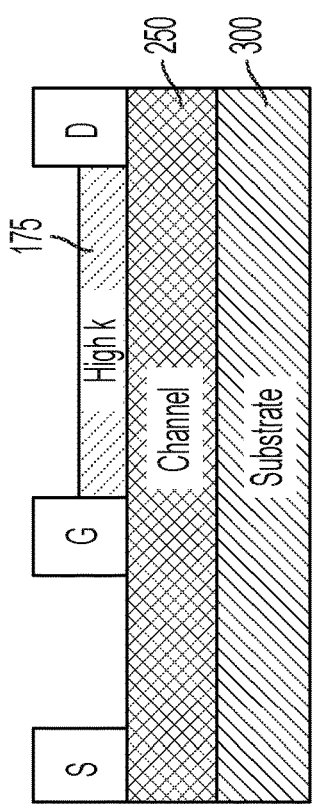
FIG. 15 is an example embodiment of a multi-layer lateral field effect transistor structure that can be built with a high-k barrier layer supporting a channel layer and a high-k passivation layer between the gate and drain as described for three terminal devices of this disclosure.
Figure 16:
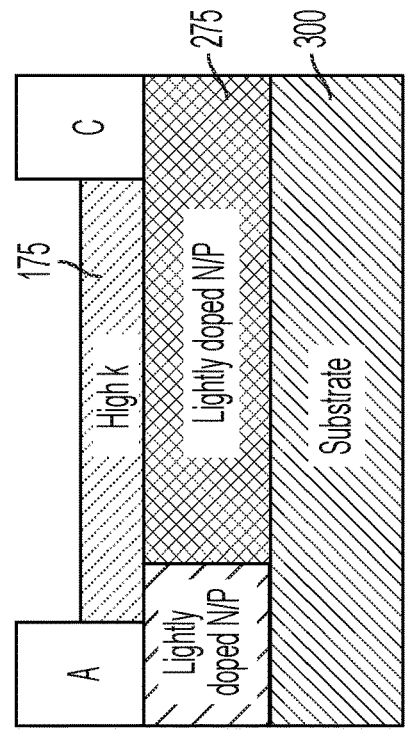
FIG. 16 is an example embodiment of a lateral Schottky diode structure that can be built with a high-k passivation layer between the cathode and anode as described in this disclosure.
Figure 17:
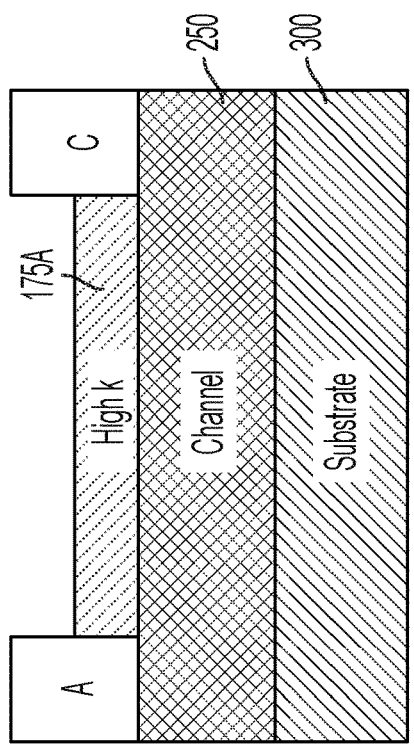
FIG. 17 is an example embodiment of a lateral PN diode structure that can be built with a high-k passivation layer between the cathode and anode and positioned over the oppositely doped semiconductor sections as described in this disclosure.
Figure 21:
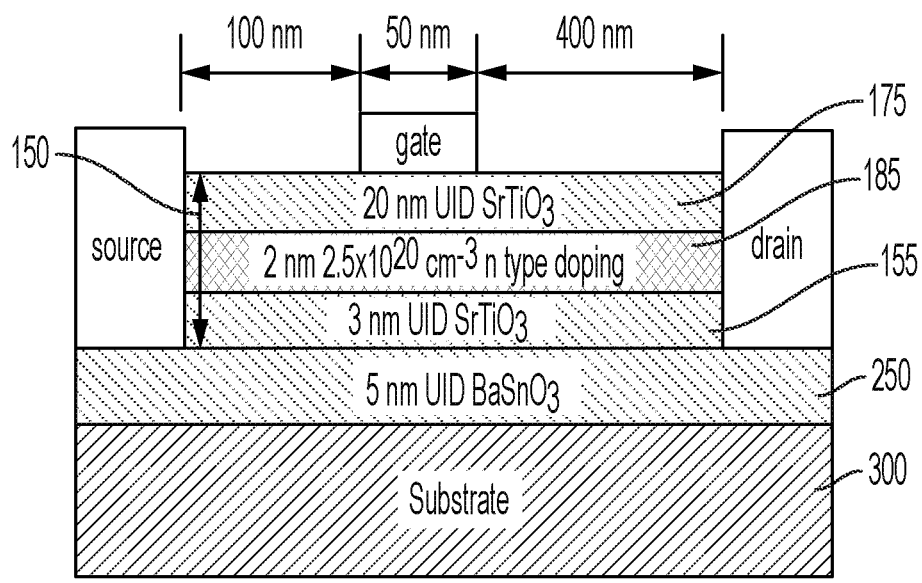
FIG. 21 is a schematic representation of a high relative permittivity dielectric super-junction field effect transistor (FET) as set forth herein.
Figure 23A:
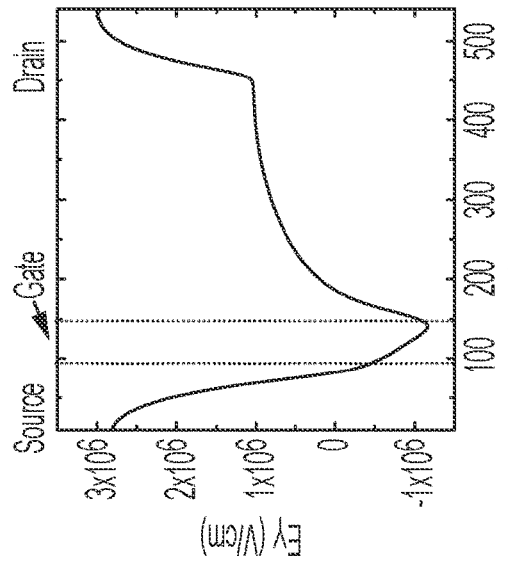
FIG. 23A is a band diagram for the FET of FIG. 21 at a second set of operating parameters as set forth herein.
Figure 23B:
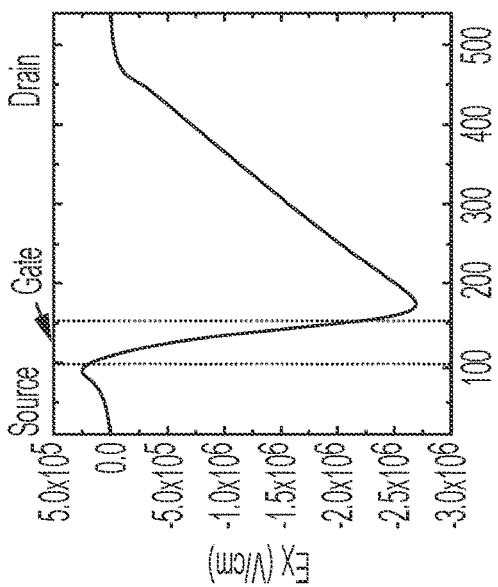
FIG. 23B is an electric field profile for the FET of FIG. 21 at a second set of operating parameters as set forth herein.
Figure 23C:
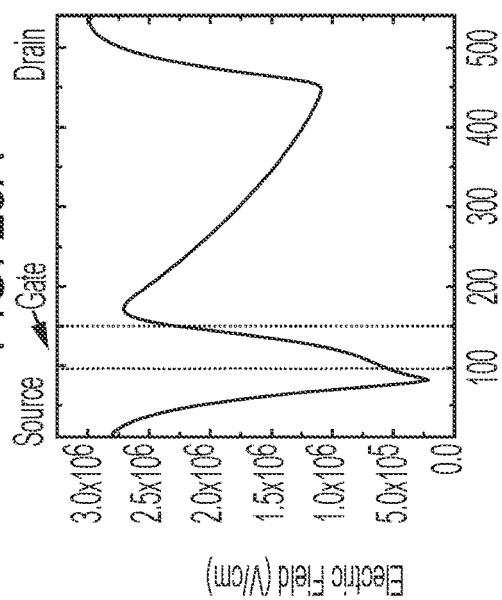
FIG. 23C is an electron concentration plot according to depth within the FET of FIG. 21 at a second set of operating parameters as set forth herein.
Figure 25:
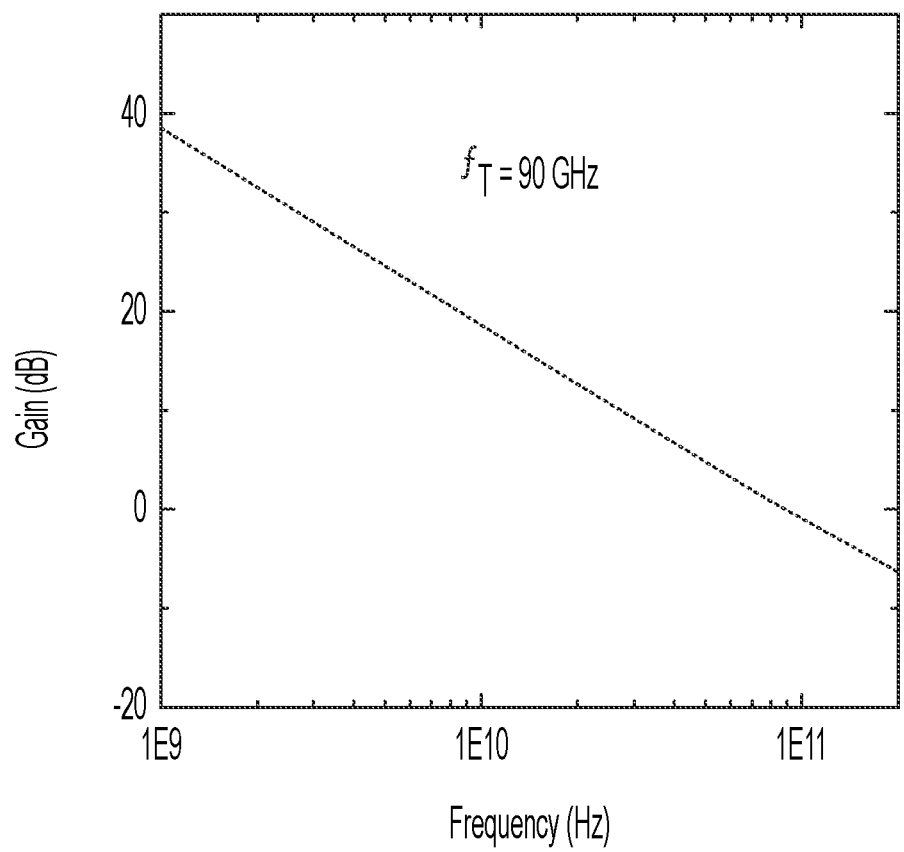
FIG. 25 is an amplification plot of Gain (db) versus Frequency (Hz) for a set of operating conditions as disclosed herein for the FET of FIG. 21.
Figure 26B:
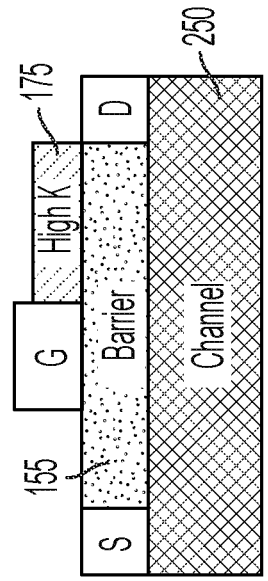
FIG. 26B is an example illustration of placing high dielectric relative permittivity layers as a passivation layer between a gate contact and a drain contact of a three terminal electronic device as described herein.
Figure 26D:
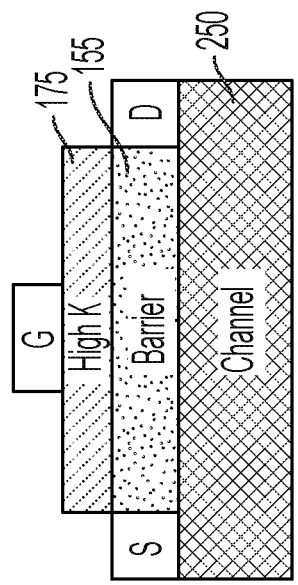
FIG. 26D is an example illustration of placing high dielectric relative permittivity layers as a passivation layer between a gate contact and barrier layer of a three terminal electronic device as described herein.
Figure 26A:
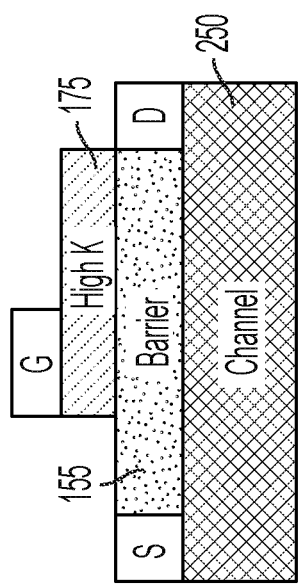
FIG. 26A is an example illustration of placing high dielectric relative permittivity layers directly under a gate contact of a three terminal electronic device as described herein.
Figure 26C:
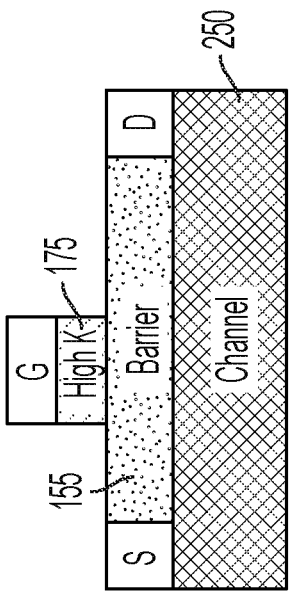
FIG. 26C is an example illustration of placing high dielectric relative permittivity layers as a passivation layer only under a gate contact of a three terminal electronic device as described herein.

As noted in FIGS. 14-20 and 26A-26D, the high dielectric constant barrier layer or passivation structures can be implemented with lower dielectric constant channel layers (or other proximate layers) to achieve the high performance of this disclosure. All of these figures show possible configurations for forming electronic devices with a substrate 300 (conductive or non-conductive), a channel 250, and a high relative permittivity (high k) barrier layer (i.e., junction portion 175). FIG. 14 shows the implementation in a lateral FET; FIG. 15 shows a lateral FET with two layers (175A, 175B) of the high-k materials. FIG. 16 exhibits a lateral Schottky diode and FIG. 17 shows a lateral PN diode with doped p and n regions 275. The concepts shown herein are equally applicable to trench MOSFETS (FIG. 18), trench Schottky diodes (FIG. 19), and Trench PN junctions (FIG. 20) which again has doped regions 185A, 185B. FIGS. 26A-26D show other embodiments of using the high k barrier 155 or high k passivation 175 with a lower dielectric permittivity channel 250. The high k junction portions may be positioned only under the gate, all the way between source and drain, or anywhere in between for the purposes at hand. Similar operation improvements are shown in FIGS. 21-25 for further proof of concept. FIG. 21 illustrates how multiple layers of the barrier 150 may incorporate the high k junction portion 175, doped regions 185, and different k barrier sections 155. The dielectric permittivity of any barrier section 155 or junction portion 175 is likely greater than the dielectric permittivity of the channel layer 250.

Embodiments of this disclosure include numerous transistors and other electronic devices having a channel layer 250 extending between a source contact and a drain contact, a barrier layer 150 in electrical communication with the channel layer, and a gate contact in electrical communication with the barrier layer. In one non-limiting embodiment, at least a junction portion 175 of the barrier layer 150 connects the gate contact and drain contact, and the junction portion of the barrier layer is configured with a junction dielectric permittivity that is greater than a channel dielectric permittivity of the channel layer. As noted above, many configurations are available for constructing the device, including the junction portion being a passivation layer on a surface of the device or the junction portion may encompass the entire barrier layer.

An electronic device according to this disclosure incorporates at least one super-junction between a high-k and low-k layer, particularly when the junction dielectric permittivity is between 2 times and 40 times greater than the channel dielectric permittivity. In one non-limiting embodiment, the junction dielectric permittivity is about 30 times greater than the channel dielectric permittivity. In another embodiment, the junction portion 175 of the barrier layer 150 extends between the gate contact and the drain contact and has a dielectric constant greater than 25. The channel layer may include a high electron mobility material but typically has a lower dielectric permittivity to accomplish the improved operation parameters shown herein. In non-limiting embodiments, the channel layer includes an at least one of BrSnO3 and GaN, GaAs, InGaAs, InP, GaN, SiC, Si, Ga2O3, and graphene. In one preferred embodiment, the high dielectric constant barrier layer or junction portion thereof comprises an oxide including but not limited to SrTiO3 and other materials having high dielectric constants.

The developments disclosed herein are applicable to both three terminal devices such as transistors and two terminal electronic devices. A two terminal embodiment includes a conductive substrate 300 in electronic communication with a cathode terminal positioned on a first face of the conductive substrate. A barrier layer 150 connected to an anode terminal and the conductive substrate, the barrier layer being spaced apart from the cathode terminal on the first face of the substrate, wherein the barrier layer is configured with a barrier dielectric permittivity that is greater than a substrate dielectric permittivity of the conductive substrate. Multilayer devices may include variously doped layers to accomplish operations at hand.

In operation, at least a junction portion 175 if not an entire barrier layer 150 is adjacent a gate contact and a drain contact in a transistor. The junction portion of the barrier layer is configured with a junction dielectric permittivity that is greater than a channel dielectric permittivity of the channel layer as discussed above. The junction portion 175 (or the barrier 150) comprises a dielectric that polarizes carriers within the junction portion 175 such that excess charge on the gate contact is compensated by an opposite charge in the junction portion 175 of the barrier layer 150 proximate the gate (i.e., near the drain facing edge of the gate). Similarly, the junction dielectric permittivity polarizes carriers within the junction portion of the barrier layer such that sheet charge in the barrier layer is increased to form a depletion region with the channel layer that avoids a conductive parallel channel in the barrier layer to the drain contact.

In conclusion, this disclosure shows through detailed device simulations that dielectric super-junctions using combinations of high-permittivity material materials and high mobility materials enable heterostructure designs that can provide additional flexibility not offered by conventional elemental and com-pound semiconductors such as Si, GaAs, and GaN. In the case of high-frequency power amplifiers, the introduction of dielectric super-junction layers can enable higher current and operating voltage, especially at millimeter-wave and terahertz frequencies. Further investigation of the material properties and device technology would enable us to fully exploit the advantages of future high-performance power and RF electronics.

The concepts discussed herein are set forth further in the claims below. The references cited herein are incorporated by reference at least for the proposition supported by each reference.

[1] E. Johnson, "Physical limitations on frequency and power parameters of transistors," in Proc. IRE Int. Cony. Rec., New York, N.Y., USA, March 1965, pp. 27-34.

[2] T. Palacios et al., "High-power AlGaN/GaN HEMTs for Ka-band applications," IEEE Electron Device Lett., vol. 26, no. 11, pp. 781-783, November 2005, doi: 10.1109/LED.2005.857701.

[3] H. Sun et al., "102-GHz AlInN/GaN HEMTs on silicon with 2.5-W/mm output power at 10 GHz," IEEE Electron Device Lett., vol. 30, no. 8, pp. 796-798, August 2009, doi: 10.1109/LED.2009.2023603.

[4] Y. Tang et al., "Ultrahigh-speed GaN high-electron-mobility transistors with fT/fmax of 454/444 GHz," IEEE Electron Device Lett., vol. 36, no. 6, pp. 549-551, June 2015, doi: 10.1109/LED.2015.2421311.

[5] R. Coffie, "Slant field plate model for field-effect transistors," IEEE Trans. Electron Devices, vol. 61, no. 8, pp. 2867-2872, August 2014, doi: 10.1109/TED.2014.2329475.

[6] A. Chini, D. Buttari, R. Coffie, S. Heikman, S. Keller, and U. K. Mishra, "12 W/mm power density AlGaN/GaN HEMTs on sapphire substrate," Electron. Lett., vol. 40, no. 1, pp. 73-74, January 2004, doi: 10.1049/e1:20040017.

[7] H. Xing, Y. Dora, A. Chini, S. Heikman, S. Keller, and U. K. Mishra, "High breakdown voltage AlGaN—GaN HEMTs achieved by multiple field plates," IEEE Electron Device Lett., vol. 25, no. 4, pp. 161-163, April 2004, doi: 10.1109/LED.2004.824845.

[8] Y.-F. Wu et al., "30-W/mm GaN HEMTs by field plate optimization," IEEE Electron Device Lett., vol. 25, no. 3, pp. 117-119, March 2004, doi: 10.1109/LED.2003.822667.

[9] T. Fujihira, "Theory of semiconductor superjunction devices," Jpn. J. Appl. Phys., vol. 36, p. 6254, October 1997, doi: 10.1143/JJAP.36.6254.

[10] T. Kabemura, S. Ueda, Y. Kawada, and K. Horio, "Enhancement of breakdown voltage in AlGaN/GaN HEMTs: Field plate plus high-k-passivation layer and high acceptor density in buffer layer," IEEE Trans. Electron Devices, vol. 65, no. 9, pp. 3848-3854, September 2018, doi: 10.1109/TED.2018.2857774.

[11] H. J. Kim et al., "High mobility in a stable transparent perovskite oxide," Appl. Phys. Express, vol. 5, no. 6, p. 061102, 2012, doi: 10.1143/APEX.5.061102.

[12] X. Luo et al., "High carrier mobility in transparent Ba1-xLaxSnO3 crystals with a wide band gap," Appl. Phys. Lett., vol. 100, no. 17, p. 172112, 2012, doi: 10.1063/1.4709415.

[13] S. Raghavan, T. Schumann, H. Kim, J. Y. Zhang, T. A. Cain, and S. Stemmer, "High-mobility BaSnO3 grown by oxide molecular beam epitaxy," APL Mater., vol. 4, no. 1, p. 016106, 2016, doi: 10.1063/1.4939657.

[14] E. H. Smith et al., "Exploiting kinetics and thermodynamics to grow phase-pure complex oxides by molecular-beam epitaxy under continuous co-deposition," Phys. Rev. Mater., vol. 1, no. 2, p. 023403, 2017, doi: 10.1103/PhysRevMaterials.1.023403.

[15] A. Prakash et al., "Hybrid molecular beam epitaxy for the growth of stoichiometric BaSnO3," J. Vac. Sci. Technol. A, Vac., Surf., Films, vol. 33, no. 6, p. 060608, 2015, doi: 10.1116/1.4933401.

[16] H. Mizoguchi, H. W. Eng, and P. M. Woodward, "Probing the electronic structures of ternary perovskite and pyrochlore oxides containing Sn4+ or Sb5+," Inorganic Chem., vol. 43, no. 5, pp. 1667-1680, 2004, doi: 10.1021/ic034551c.

[17] S. A. Chambers, T. C. Kaspar, A. Prakash, G. Haugstad, and B. Jalan, "Band alignment at epitaxial BaSnO3/SrTiO3(001) and BaSnO3/LaAlO3(001) heterojunctions," Appl. Phys. Lett., vol. 108, no. 15, p. 152104, 2016, doi: 10.1063/1.4946762.

[18] S. J. Allen, S. Raghavan, T. Schumann, K.-M. Law, and S. Stemmer, "Conduction band edge effective mass of La-doped BaSnO3," Appl. Phys. Lett., vol. 108, no. 25, p. 252107, 2016, doi: 10.1063/1.4954671.

[19] F. M. Pontes, E. J. H. Lee, E. R. Leite, E. Longo, and J. A. Varela, "High dielectric constant of SrTiO3 thin films prepared by chemical process," J. Mater. Sci., vol. 35, no. 19, pp. 4783-4787, 2000, doi: 10.1023/A:1004816611050.

[20] H. Tabata, H. Tanaka, and T. Kawai, "Formation of artificial BaTiO3/SrTiO3 superlattices using pulsed laser deposition and their dielectric properties," Appl. Phys. Lett., vol. 65, no. 15, pp. 1970-1972, 1994, doi: 10.1063/1.112837.

[21] C. M. Carlson et al., "Large dielectric constant ($\varepsilon/\varepsilon0 > 6000$) Ba0.4Sr0.6TiO3 thin films for high-performance microwave phase shifters," Appl. Phys. Lett., vol. 76, no. 14, pp. 1920-1922, 2000, doi: 10.1063/1.126212.

[22] C. T. Black and J. J. Weiser, "Electric-field penetration into metals: Consequences for high-dielectric-constant capacitors," IEEE Trans. Electron Devices, vol. 46, no. 4, pp. 776-780, April 1999, doi: 10.1109/16.753713.

[23] D. E. Cox, B. Noheda, G. Shirane, Y. Uesu, K. Fujishiro, and Y. Yamada, "Universal phase diagram for high-piezoelectric perovskite systems," Appl. Phys. Lett., vol. 79, no. 3, pp. 400-402, 2001, doi: 10.1063/1.1384475.

[24] K. J. Choi et al, "Enhancement of ferroelectricity in strained BaTiO3 thin films," Science, vol. 306, no. 5698, pp. 1005-1009, 2004, doi: 10.1126/science.1103218.

[25] M. N. Kamalasanan, S. Chandra, P. C. Joshi, and A. Mansingh, "Structural and optical properties of sol-gel-processed BaTiO3 ferroelectric thin films," Appl. Phys. Lett., vol. 59, no. 27, pp. 3547-3549, 1991, doi: 10.1063/1.105653.

[26] G. H. Jonker and J. H. Van Santen, "Ferromagnetic compounds of manganese with perovskite structure," Physica, vol. 16, no. 3, pp. 337-349, 1950, doi: 10.1016/0031-8914(50)90033-4.

[27] Y. Moritomo, T. Akimoto, A. Nakamura, K. Ohoyama, and M. Ohashi, "Antiferromagnetic metallic state in the heavily doped region of perovskite manganites," Phys. Rev. B, Condens. Matter, vol. 58, no. 9, p. 5544, 1998, doi: 10.1103/PhysRevB.58.5544.

[28] K. Krishnaswamy, L. Bjaalie, B. Himmetoglu, A. Janotti, L. Gordon, and C. G. Van de Walle, "BaSnO3 as a channel material in perovskite oxide heterostructures," Appl. Phys. Lett., vol. 108, no. 8, p. 083501, 2016, doi: 10.1063/1.4942366.

[29] S. A. Chambers, T. C. Kaspar, A. Prakash, G. Haugstad, and B. Jalan, "Band alignment at epitaxial BaSnO3/SrTiO3(001) and BaSnO3/LaAlO3(001) heterojunctions," Appl. Phys. Lett., vol. 108, no. 15, p. 152104, 2016, doi: 10.1063/1.4946762.

[30] L. Bjaalie, B. Himmetoglu, L. Weston, A. Janotti, and C. G. Van de Walle, "Oxide interfaces for novel electronic applications," New J. Phys., vol. 16, no. 2, p. 025005, 2014, doi: 10.1088/1367-2630/16/2/025005.

[31] S. Bajaj et al., "Density-dependent electron transport and precise modeling of GaN high electron mobility transistors," Appl. Phys. Lett., vol. 107, no. 15, p. 153504, 2015, doi: 10.1063/1.4933181.

[32] J. Khurgin, Y. J. Ding, and D. Jena, "Hot phonon effect on electron velocity saturation in GaN: A second look," Appl. Phys. Lett., vol. 91, no. 25, p. 252104, 2007, doi: 10.1063/1.2824872.

[33] H. J. Kim et. al., "Determination of temperature-dependent thermal conductivity of a BanSnO3-6 single crystal by using the 3ω method," Thermochimica Acta, vol. 585, no. 10, pp. 16-20, 2014, doi: 10.1016/j.tca.2014.03.036.

The invention claimed is:

1. An apparatus comprising:
  a channel layer exhibiting an electrical current therein;
  a barrier layer in electrical communication with the channel layer, the barrier layer comprising a doped donor region having a charge carrier concentration greater than a remaining portion of the barrier layer;
  a gate contact in electrical communication with the barrier layer and controlling the electrical current in the channel layer;
  wherein at least a junction portion of the barrier layer is adjacent the doped donor region, and the junction portion of the barrier layer is configured with a junction dielectric permittivity that is greater than a channel dielectric permittivity of the channel layer;
  wherein the junction portion of the barrier layer is between the doped donor region and the channel layer and connects to the drain contact.

2. The apparatus according to claim 1, wherein the junction portion of the barrier layer is between the gate contact and the doped donor region and connects to the drain contact.

3. The apparatus according to claim 1, wherein the junction dielectric permittivity is between 2 times and 40 times greater than the channel dielectric permittivity.

4. The apparatus according to claim 3, wherein the junction dielectric permittivity is 30 times greater than the channel dielectric permittivity.

5. The apparatus according to claim 1, wherein the junction portion of the barrier layer extends between the gate contact and the drain contact and has a dielectric constant greater than 25.

6. A two terminal electronic device comprising:
  a conductive substrate in electronic communication with a cathode terminal positioned on a first face of the conductive substrate;
  a barrier layer connected to an anode terminal and the conductive substrate, the barrier layer being spaced apart from the cathode terminal on the first face of the substrate, wherein the barrier layer is configured with a barrier dielectric permittivity that is greater than a substrate dielectric permittivity of the conductive substrate, and wherein the barrier layer comprises a first doped donor region having a charge carrier concentration greater than a remaining portion of the barrier layer.

7. The two terminal electronic device according to claim 6, wherein the barrier layer comprises a second doped donor region having a charge carrier concentration greater than a remaining portion of the barrier layer and lower than the first doped donor region.

8. An apparatus comprising:
a channel layer configured for conducting current to a drain contact;
a barrier layer in electrical communication with the channel layer;
a gate contact in electrical communication with the barrier layer and controlling, at least in part, the current in the channel layer;
wherein at least a junction portion of the barrier layer is adjacent the gate contact and the drain contact, and the junction portion of the barrier layer is configured with a junction dielectric permittivity that is greater than a channel dielectric permittivity of the channel layer, and
wherein the junction portion comprises a dielectric that polarizes carriers within the junction portion such that excess charge on the gate is compensated by an opposite charge in the junction portion of the barrier layer proximate the gate, and
wherein the junction dielectric permittivity polarizes carriers within the junction portion of the barrier layer such that sheet charge in the barrier layer is increased to form a depletion region with the channel layer that avoids a conductive parallel channel in the barrier layer to the drain contact.

9. The apparatus according to claim 8, wherein the junction dielectric permittivity is about 30 times greater than the channel dielectric permittivity.

* * * * *